(12) United States Patent
Okita et al.

(10) Patent No.: US 8,231,798 B2
(45) Date of Patent: *Jul. 31, 2012

(54) PLASMA PROCESSING APPARATUS AND PLASMA PROCESSING METHOD

(75) Inventors: Shogo Okita, Hyogo (JP); Hiromi Asakura, Hyogo (JP); Syouzou Watanabe, Osaka (JP); Ryuzou Houchin, Osaka (JP); Hiroyuki Suzuki, Osaka (JP)

(73) Assignee: Panasonic Corporation, Osaka (JP)

(*) Notice: Subject to any disclaimer, the term of this patent is extended or adjusted under 35 U.S.C. 154(b) by 386 days.

This patent is subject to a terminal disclaimer.

(21) Appl. No.: 12/578,844

(22) Filed: Oct. 14, 2009

(65) Prior Publication Data
US 2010/0051584 A1    Mar. 4, 2010

Related U.S. Application Data

(62) Division of application No. 12/090,214, filed as application No. PCT/JP2006/320216 on Oct. 10, 2006, now Pat. No. 7,736,528.

(30) Foreign Application Priority Data

Oct. 12, 2005  (JP) .................. 2005-297378
Oct. 12, 2005  (JP) .................. 2005-297380

(51) Int. Cl.
*B44C 1/22* (2006.01)
(52) U.S. Cl. ......... 216/58; 216/67; 216/71; 156/345.47; 156/345.52
(58) Field of Classification Search .............. 216/58, 216/67, 71; 156/345.47, 345.52, 345.54, 156/345.55
See application file for complete search history.

(56) References Cited

U.S. PATENT DOCUMENTS

| 6,344,105 B1 | 2/2002 | Daugherty et al. |
| 6,492,612 B1 | 12/2002 | Taguchi et al. |
| 7,658,816 B2 | 2/2010 | Koshiishi et al. |

(Continued)

FOREIGN PATENT DOCUMENTS

JP    2-113330    9/1990

(Continued)

OTHER PUBLICATIONS

Japanese Office Action issued Jun. 21, 2011 in corresponding Japanese Application No. 2009-019862.

(Continued)

*Primary Examiner* — Binh X Tran
(74) *Attorney, Agent, or Firm* — Wenderoth Lind & Ponack, L.L.P.

(57) ABSTRACT

A tray for a dry etching apparatus includes substrate accommodation holes penetrating a thickness direction and a substrate support portion supporting an outer peripheral edge portion of a lower surface of a substrate. A dielectric plate includes a tray support surface supporting a lower surface of the tray, substrate placement portions inserted from a lower surface side of the tray into the substrate accommodation holes and having a substrate placement surface at its upper end surface. A dc voltage applying mechanism applies a dc voltage to an electrostatic attraction electrode. A heat conduction gas supply mechanism supplies a heat conduction gas between the substrate and substrate placement surface. The substrate is retained on the substrate placement surface with high degree of adhesion. Cooling efficiency of the substrate is improved and processing is uniform at the entire region of the substrate surface.

4 Claims, 25 Drawing Sheets

U.S. PATENT DOCUMENTS

| | | | |
|---|---|---|---|
| 7,736,528 B2* | 6/2010 | Okita et al. | 216/58 |
| 2004/0055540 A1* | 3/2004 | Kanno et al. | 118/724 |
| 2004/0085706 A1* | 5/2004 | Tomoyoshi | 361/234 |
| 2004/0154540 A1* | 8/2004 | Hayami et al. | 118/723 E |
| 2004/0168767 A1* | 9/2004 | Kanno et al. | 156/345.27 |
| 2004/0261946 A1 | 12/2004 | Endoh et al. | |
| 2009/0255901 A1 | 10/2009 | Okita et al. | |

FOREIGN PATENT DOCUMENTS

| | | |
|---|---|---|
| JP | 4-313220 | 11/1992 |
| JP | 6-34243 | 5/1994 |
| JP | 7-335616 | 12/1995 |
| JP | 8-316286 | 11/1996 |
| JP | 11-121600 | 4/1999 |
| JP | 2000-49207 | 2/2000 |
| JP | 2000-58514 | 2/2000 |
| JP | 2000-252267 | 9/2000 |
| JP | 2001-7090 | 1/2001 |
| JP | 2001-230234 | 8/2001 |
| JP | 2003-503841 | 1/2003 |
| JP | 2003-197607 | 7/2003 |
| JP | 2004-259825 | 9/2004 |
| JP | 2004-259826 | 9/2004 |
| JP | 2004-273533 | 9/2004 |
| JP | 2005-64460 | 3/2005 |
| JP | 2005277369 | 10/2005 |
| JP | 2007-109770 | 4/2007 |
| WO | 00/41229 | 7/2000 |
| WO | 01/01445 | 1/2001 |

OTHER PUBLICATIONS

International Search Report issued Dec. 26, 2006 in the International (PCT) Application No. PCT/JP2006/320216.

International Preliminary Report on Patentability issued Apr. 24, 2008 in the International (PCT) Application No. PCT/JP2006/320216.

Korean Office Action issued Jan. 14, 2010 in the corresponding application No. 10-2008-7008556 (with English translation).

* cited by examiner

Fig.25
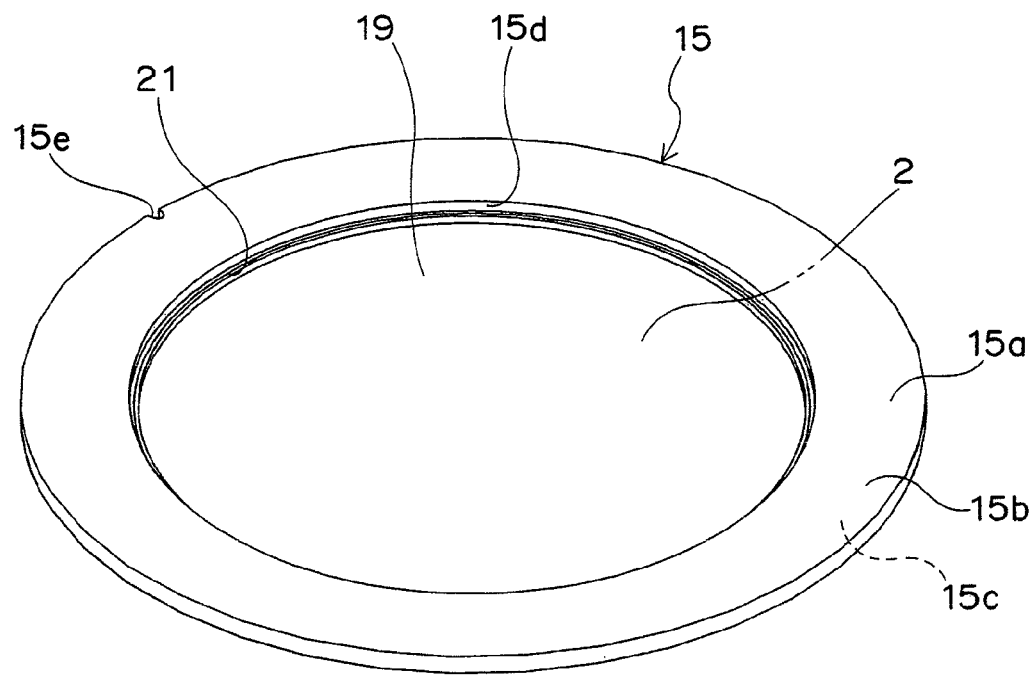
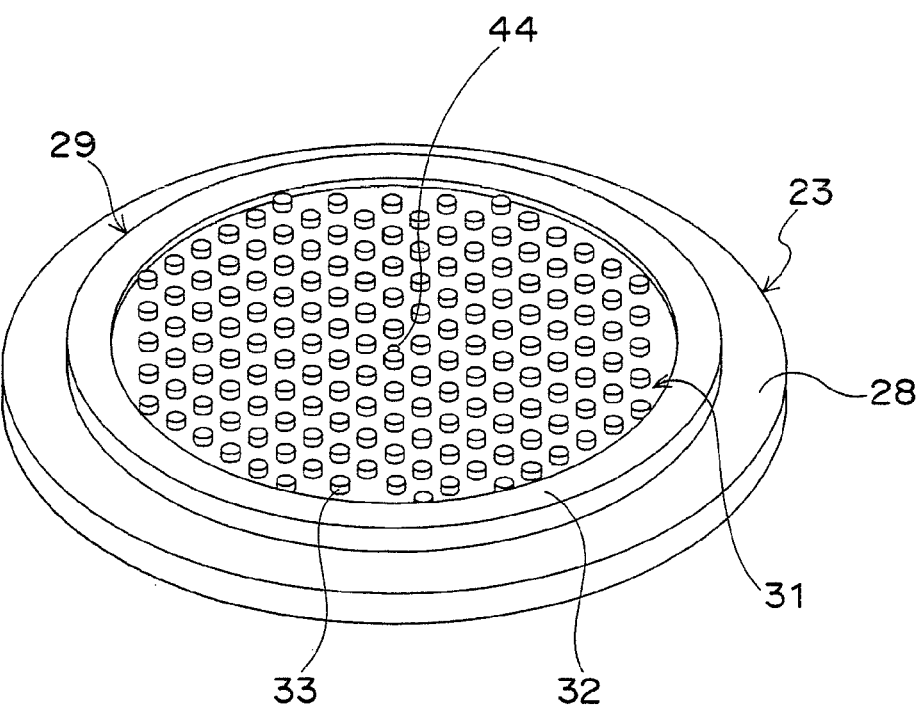

PLASMA PROCESSING APPARATUS AND PLASMA PROCESSING METHOD

This is a Rule 1.53(b) Divisional of application Ser. No. 12/090,214, filed Jul. 29, 2008 now U.S. Pat. No. 7,736,528, which is the National Stage of International Application No. PCT/JP2006/320216, filed Oct. 10, 2006.

BACKGROUND OF THE INVENTION

1. Technical Field

The present invention relates to a plasma processing apparatuses, such as a dry etching apparatus and CVD apparatus, a plasma processing method and a tray for the plasma processing apparatus.

2. Background Art

JP 2000-58514 A discloses plasma processing apparatus of a construction such that a bottomed tray accommodating a substrate is placed on a substrate susceptor that functions as a lower electrode. The substrate is electrostatically attracted to the substrate susceptor indirectly via the tray. A cooling mechanism is provided for the substrate susceptor, and the substrate is cooled by indirect heat conduction to the substrate susceptor via the tray.

JP 2003-197607 A discloses a plasma processing apparatus of a construction such that a bottomed tray accommodating a substrate is placed on a substrate susceptor with a vicinity of an outer peripheral edge of the substrate being pressurized against the substrate susceptor side by a clamp ring, whereby the substrate is fixed to the substrate susceptor. A flow passage that penetrates the tray and reaches a lower surface of the substrate is provided such that the back surface of the substrate is cooled by a coolant gas supplied via the flow passage.

However, in the plasma processing apparatus disclosed in the former publication, the substrate is electrostatically attracted indirectly to the substrate susceptor via the tray and merely cooled by indirect heat conduction to the substrate susceptor via the tray. Therefore, the substrate cannot be efficiently cooled.

On the other hand, in the plasma processing apparatus disclosed in the latter publication, the state of the plasma tends to become unstable particularly at the vicinity of the outer peripheral edge of the substrate where the clamp ring exists. This results in that the processing cannot be uniformed at a center portion and the vicinity of the outer peripheral edge of the substrate. For example, in the case of dry etching, no etching pattern can be formed at the vicinity of the outer peripheral edge of the substrate where the clamp ring exists.

Further, in the conventionally proposed plasma processing apparatuses adopting the system where the tray accommodating the substrate is placed on the substrate susceptor, including those disclosed in the above-mentioned two publications, positioning accuracy of the substrate with respect to the substrate susceptor is not sufficiently considered. However, the positioning accuracy of the substrate with respect to the substrate susceptor is important particularly in achieving batch processing of a plurality of substrates accommodated on one tray.

SUMMARY OF THE INVENTION

Objects of the present invention are, in a plasma processing apparatus where a tray accommodating a substrate is placed on a substrate susceptor, to improve cooling efficiency of the substrate by retaining the substrate with high degree of adhesion to the substrate susceptor, to uniform processing at an entire area of the substrate surface including a vicinity of an outer peripheral edge thereof, and to improve the positioning accuracy of the substrate with respect to the substrate susceptor.

A first aspect of the invention provides a plasma processing apparatus comprising, a tray formed with a substrate accommodation hole penetrating through thickness thereof, and provided with a substrate support portion that projects from a hole wall of the substrate accommodation hole and supports an outer peripheral edge portion of a lower surface of a substrate accommodated in the substrate accommodation hole, a dielectric member provided with a tray support portion that supports a lower surface of the tray, a substrate placement portion that projects upward from the tray support portion, is inserted into the substrate accommodation hole from the lower surface side of the tray, and has a substrate placement surface of its upper end surface on which the lower surface of the substrate is placed, and an electrostatic attraction electrode embedded therein for electrostatically attracting the substrate to the substrate placement surface.

The lower surface of the substrate is placed directly on the dielectric member without interposition of the tray. Specifically, the substrate placement portion of the dielectric member is inserted from the lower surface side of the tray into the substrate accommodation hole, and then the substrate is placed on the substrate placement surface that is the upper end surface of the substrate placement portion. Therefore, when the dc voltage is applied from the dc voltage applying mechanism to the electrostatic attraction electrode, the substrate is retained on the substrate placement surface with high degree of adhesion. This consequently allows a thermal conductivity between the substrate and the substrate placement surface via the heat conduction gas to be satisfactory, the substrate to be cooled with high cooling efficiency, and the substrate temperature to be controlled with high accuracy.

Since the substrate is placed directly on the substrate placement surface and electrostatically attracted, a member of a clamp ring or the like for mechanically pressurizing the outer peripheral edge portion of the upper surface of the substrate against the dielectric member is unnecessary. In other words, there is no member that might cause instability of the state of the plasma not only at the center portion but also at a vicinity of the outer peripheral edge of the upper surface of the substrate subjected to plasma processing. Therefore, uniform plasma processing can be achieved in the entire region of the substrate surface including the vicinity of the outer peripheral edge.

By making the substrate placement portion enter the inside of the substrate accommodation hole of the tray, the substrate is placed on the substrate placement surface. Therefore, the substrate can be retained on the substrate placement surface with high positioning accuracy.

A second aspect of the invention provides a plasma processing method comprising, providing a tray formed with a substrate accommodation hole that penetrates through thickness thereof, and provided with a substrate support portion that projects from a hole wall of the substrate accommodation hole, accommodating a substrate in the substrate accommodation hole of the tray, thereby an outer peripheral edge portion of a lower surface of the substrate being supported by the substrate support portion so that the lower surface of the substrate is exposed by the substrate accommodation hole viewed from a lower surface side of the tray, placing the tray with the substrate accommodated therein above a dielectric member accommodated in a vacuum vessel, moving down the tray toward the dielectric member so that the lower surface of the tray is supported by a tray support portion of an insulating member and so that the substrate placement portion projecting from the tray support portion enters the substrate accommodation hole from the lower surface side of the tray, thereby the lower surface of the substrate being placed on a substrate placement surface that is an upper end surface of the substrate placement portion, electrostatically attracting the substrate to the substrate placement surface by applying a dc voltage to an electrostatic attraction electrode embedded in the dielectric member, and supplying a heat conduction gas between the lower surface of the substrate and the substrate placement surface, thereby generating plasma in the vacuum vessel.

A third aspect of the invention provides a tray for a plasma processing apparatus, comprising, a tray main body formed with a substrate accommodation hole that penetrates through thickness thereof and accommodating a substrate therein; and a substrate support portion projecting from a hole wall of the substrate accommodation hole and supporting an outer peripheral edge portion of the substrate accommodated in the substrate accommodation hole so that a lower surface is exposed through the substrate accommodation hole viewed from a lower surface side of the tray main body.

Since the lower surface of the substrate is exposed through the substrate accommodation hole, the substrate can be placed directly on the substrate susceptor of the plasma processing apparatus without interposition of the tray. Therefore, the substrate can be retained on the substrate susceptor by electrostatic attraction with high degree of adhesion. This consequently allows the thermal conductivity between the substrate and the substrate susceptor to be satisfactory, the substrate to be cooled with high cooling efficiency, and the substrate temperature to be controlled with high accuracy.

Since the substrate is placed directly on the substrate susceptor, the substrate can be fixed by electrostatic attraction to the substrate susceptor with high degree of adhesion. Therefore, a member of a clamp ring or the like for mechanically pressurizing the outer peripheral edge portion of the upper surface of the substrate against the substrate susceptor is unnecessary. In other words, there is no member that might cause instability of the state of the plasma not only at the center portion but also at the vicinity of the outer peripheral edge of the upper surface of the substrate subjected to plasma processing. Therefore, uniform plasma processing can be achieved in the entire region of the substrate surface including the vicinity of the outer peripheral edge.

By making the substrate susceptor partially enter the inside of the substrate accommodation hole of the tray, the substrate can be placed directly on the substrate susceptor. Therefore, the positioning accuracy of the substrate with respect to the substrate susceptor can be improved.

According to the present invention, the substrate is placed directly on the substrate placement surface and electrostatically attracted without interposition of the tray. This therefore allows the substrate to be retained on the substrate placement surface with high degree of adhesion, the cooling efficiency of the substrate to be improved, and the substrate temperature to be controlled with high accuracy. Further, a member of a clamp ring or the like for mechanically pressurizing the outer peripheral edge portion of the upper surface of the substrate against the dielectric member is unnecessary, and therefore, uniform plasma processing can be achieved in the entire region of the substrate surface including the vicinity of the outer peripheral edge. Furthermore, since the substrate is placed on the substrate placement surface by inserting the substrate placement portion into the substrate accommodation hole of the tray, the positioning accuracy of the substrate with respect to the dielectric member can be improved.

BRIEF DESCRIPTION OF DRAWINGS

FIG. 25 is a schematic perspective view showing a tray and a dielectric plate provided for the dry etching apparatus according to the ninth embodiment of the present invention;

DETAILED DESCRIPTION OF THE INVENTION (First Embodiment)

Figure 1:
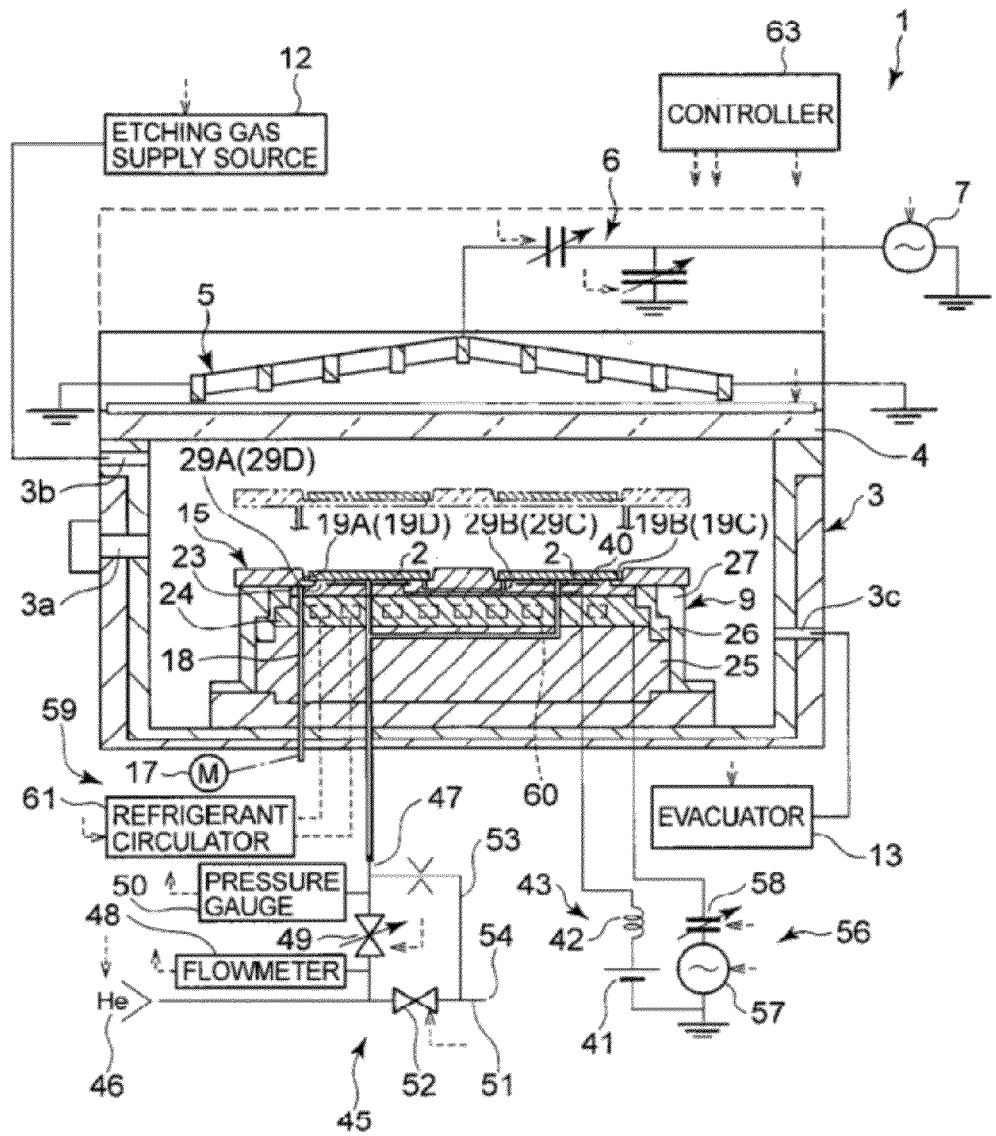
FIG. 1 is a schematic sectional view of a dry etching apparatus according to a first embodiment of the present invention.
Figure 2:
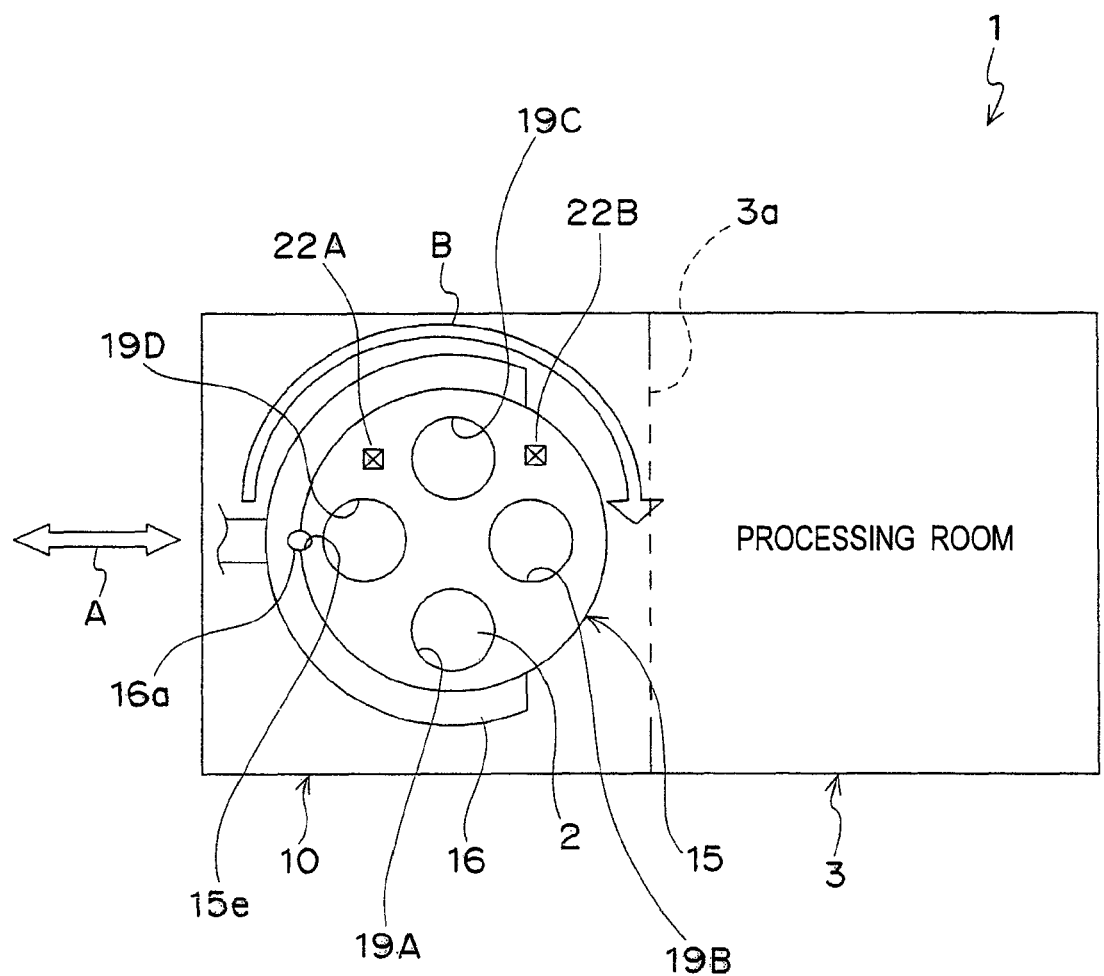
FIG. 2 is a schematic plan view of the dry etching apparatus according to the first embodiment of the present invention.

FIGS. 1 and 2 show a dry etching apparatus 1 of ICP (Induction Coupling Plasma) type according to a first embodiment of the present invention.

The dry etching apparatus 1 has a chamber (vacuum vessel) 3 that constitutes a processing chamber in which a substrate 2 is subjected to plasma processing. The chamber 3 has an upper end opening closed in a sealed state with a top plate 4 made of a dielectric substance of quartz or the like. An ICP coil 5 is arranged above the top plate 4. A high-frequency power source 7 is electrically connected to the ICP coil 5 via a matching circuit 6. Provided in a bottom side of in the chamber so as to be opposed to the top plate 4 is a substrate susceptor 9 that has a function as a lower electrode to which a bias voltage is applied and a function as a retainer of the substrate 2. The chamber 3 has an operable gate 3a for loading and unloading which communicates with an adjacent load dock chamber 10 (see FIG. 2). Further, an etching gas supply source 12 is connected to an etching gas supply inlet 3b provided at the chamber 3. The etching gas supply source 12 having an MFC (Mass Flow Controller) or the like can supply an etching gas at a desired flow rate from the etching gas supply inlet 3b. Furthermore, an evacuator 13 having a vacuum pump or the like is connected to an exhaust port 3c provided at the chamber 3.

Figure 3:
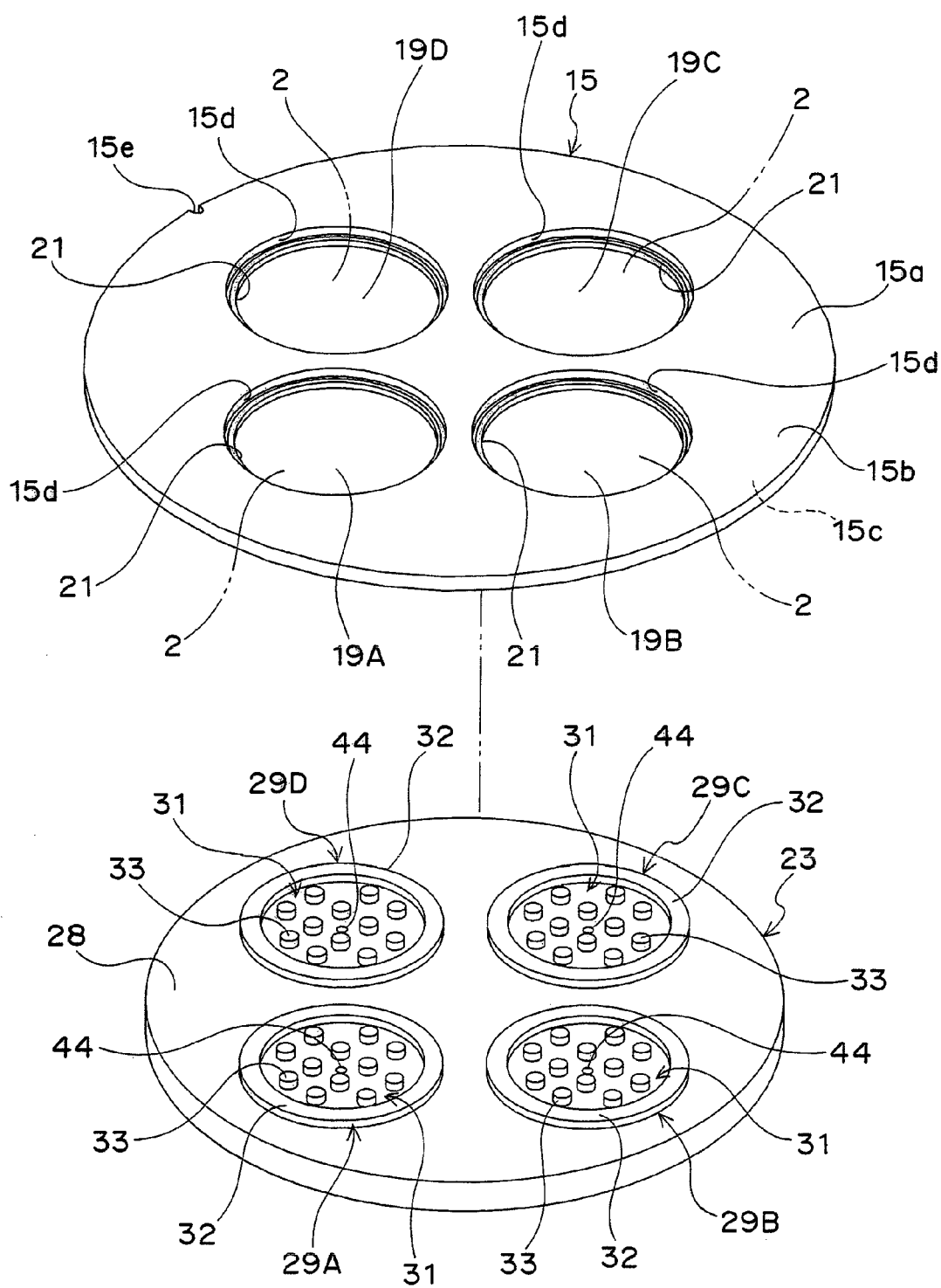
FIG. 3 is a perspective view showing a tray and dielectric plate.
Figure 4A:
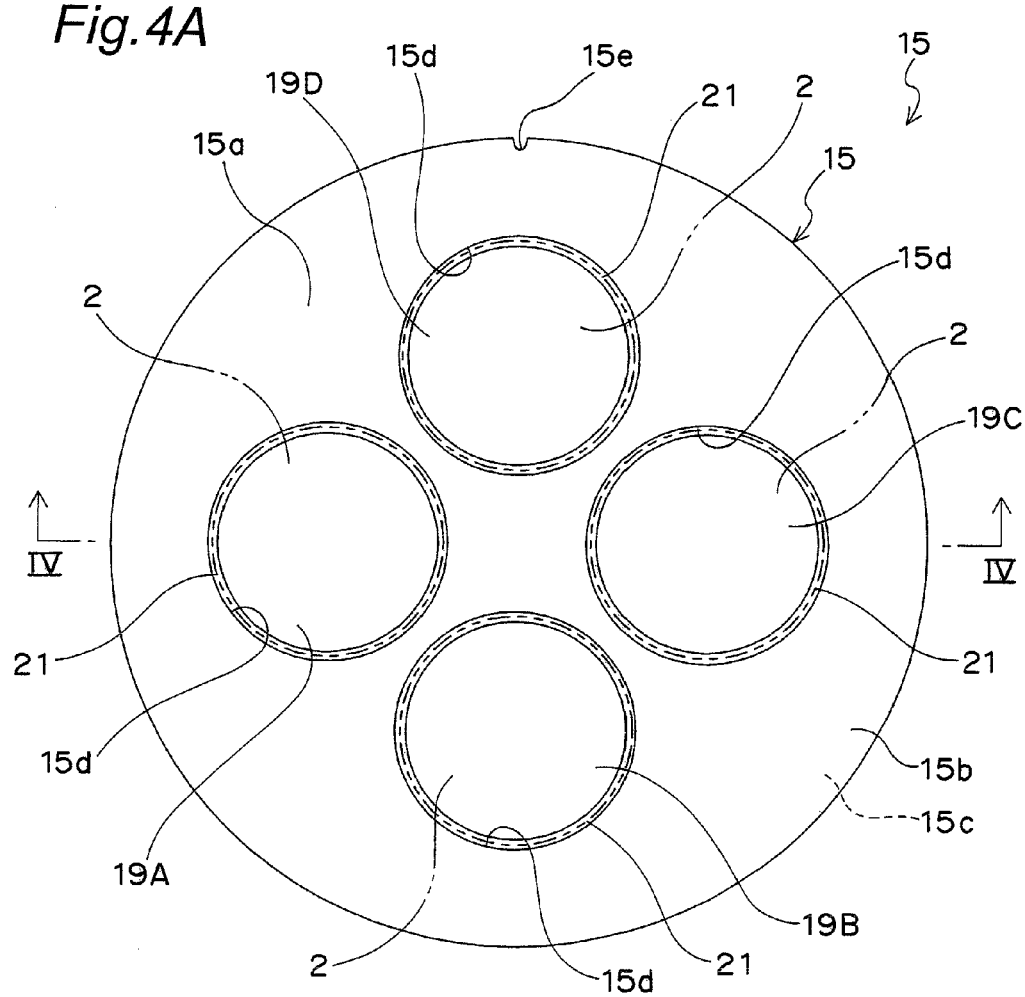
FIG. 4A is a plan view of the tray.
Figure 4B:
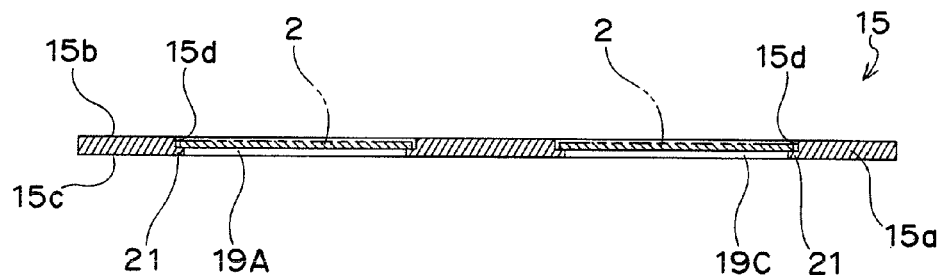
FIG. 4B is a sectional view taken along a line IV-IV of FIG. 4A.

In the present embodiment, four substrates 2 are accommodated in one tray 15 shown in FIGS. 3 through 4B, and the tray 15 is loaded from the load dock chamber 10 into the chamber 3 (processing chamber) through the gate 3a. Referring to FIG. 2, a conveyance arm 16 capable of linearly moving in a horizontal direction (see arrow A) and rotating in a horizontal plane (see arrow B) is provided. Further, provided in the chamber 3 is an elevation pin 18 that penetrates the substrate susceptor 9 and is moved up and down by being driven by a drive unit 17. During loading of the tray 15, the conveyance arm 16 supporting the tray 15 enters the chamber 3 from the load dock chamber 10 through the gate 3a. At this time, since the elevation pin 18 is in an elevated position as indicated by a two-dot chain line in FIG. 1, and then the tray 15 is transferred onto an upper end of the elevation pin 18 from the conveyance arm 16 that has entered the inside of the chamber 3. In this state, the tray 15 is located above the substrate susceptor 9 with interposition of a clearance. Subsequently, the elevation pin 18 is moved down to a lowered position indicated by a solid line in FIG. 1, and thereby the tray 15 and the substrate 2 are placed on the substrate susceptor 9. During unloading of the tray 15 after the end of the plasma processing, the elevation pin 18 is moved up to the elevated position, and then the tray 15 is transferred to the conveyance arm 16 that has entered the inside of the chamber 3 from the load dock chamber 10.

The tray 15 is described with reference to FIGS. 3 through 5B. The tray 15 has a tray main body 15a of a thin disk-like shape. Materials for the tray 15 include, for example, ceramics materials such as alumina ($Al_2O_3$), aluminum nitride (AlN), zirconia (ZrO), yttria ($Y_2O_3$), silicon nitride (SiN), silicon carbide (SiC) and the like, and metals of aluminum covered with alumite, aluminum having a surface to which ceramics are thermally sprayed, aluminum coated with a resin material and the like. For Cl based processes, it can be considered to adopt alumina, yttria, silicon carbide, aluminum nitride or the like. For F based processes, it can be considered to adopt quartz, crystal, yttria, silicon carbide, aluminum to the surface of which alumite is thermally sprayed or the like.

The tray main body 15a is formed with four substrate accommodation holes 19A through 19D that penetrate through the thickness direction from an upper surface 15b to a lower surface 15c. The substrate accommodation holes 19A through 19D are arranged at equiangular intervals with respect to a center of the tray main body 15a when viewed from the upper surface 15b and the lower surface 15c. As most clearly shown in FIGS. 5A and 5B, a substrate support portion 21 that projects toward the center of each of the substrate accommodation holes 19A through 19D is provided on the lower surface 15c side of a hole wall 15d of each of the substrate accommodation holes 19A through 19D. In the present embodiment, the substrate support portion 21 is provided on the entire circumference of the hole wall 15d and has an annular shape in plan view.

Figure 5A:
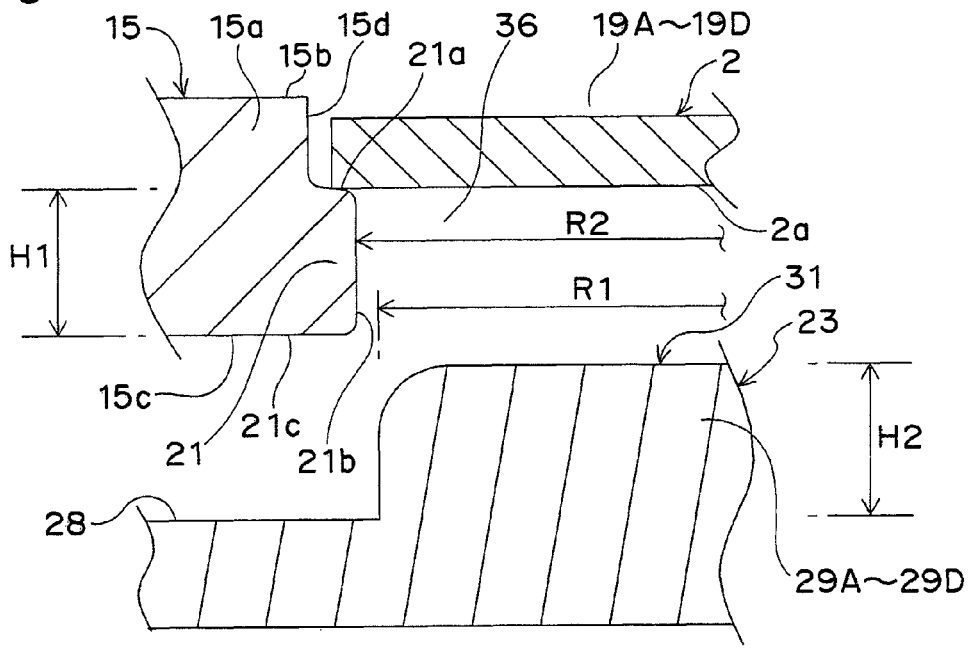
FIG. 5A is a partially enlarged sectional view of the tray and the dielectric plate (before being placed on the tray)

One substrate 2 is accommodated in each of the substrate accommodation holes 19A and 19B. As shown in FIG. 5A, the outer peripheral edge portion of the lower surface 2a of each of the substrates 2 accommodated in the substrate accommodation holes 19A and 19B is supported by the upper surface 21a of the substrate support portion 21. Further, since the substrate accommodation holes 19A through 19D are formed so as to penetrate the tray main body 15a in the thickness direction as described above, the lower surface 2a of the substrate 2 is exposed through each of the substrate accommodation holes 19A through 19D when viewed from the lower surface 15c side of the tray main body 15a.

A positioning notch 15e that is a partial cut at the outer peripheral edge is provided at the tray main body 15a. As shown in FIG. 2, when the tray is placed on the conveyance arm 16 for loading and unloading described above, a positioning projection 16a of the conveyance arm 16 is fitted into the positioning notch 15e. By detecting the positioning notch 15e and the positioning projection 16a by means of sensors 22A and 22B provided in the load dock chamber 10, a rotational angle position of the tray 15 can be detected.

The substrate susceptor 9 is described with reference to FIGS. 1, 3 and 5A through 6B. First, referring to FIG. 1, the substrate susceptor 9 comprises a dielectric plate (dielectric member) 23 made of ceramics or the like, metal plate (support member) 24 made of aluminum to the surface of which an alumite coating is formed and functioning as a pedestal electrode, a spacer plate 25 made of ceramics or the like, a guide cylinder body 26 made of ceramics or the like, and a grounding shield 27 made of metal in the present embodiment. The dielectric plate 23 that constitutes the uppermost portion of the substrate susceptor 9 is fixed to an upper surface of the metal plate 24. Further, the metal plate 24 is fixed on the spacer plate 25. Further, outer peripheries of the dielectric plate 23 and the metal plate 24 are covered with the guide cylinder 26. An outer side of the cylinder 26 and an outer periphery of the spacer are covered with the grounding shield 27.

Referring to FIGS. 3 and 5A through 6B, the dielectric plate 23 has a thin disk-like shape as a whole and a circular external shape in plan view. The upper end surface of the dielectric plate 23 constitutes a tray support surface (tray support portion) 28 that supports the lower surface 15c of the tray 15. Further, four substrate placement portions 29A through 29D project upward from the tray support surface 28. The substrate placement portions 29A through 29D respectively have short columnar shape and correspond to the substrate accommodation holes 19A through 19D of the tray 15.

The upper end surface of each of the substrate placement portions 29A through 29D constitutes a substrate placement surface 31 on which the lower surface 2a of a substrate 2 is placed. Further, provided at each of the substrate placement portions 29A through 29D is an annular projection 32 which projects upward from an outer peripheral edge of the substrate placement surface 31 and of which an upper end surface supports the lower surface 2a of the substrate 2. Further, a plurality of columnar projections 33 of which the diameter is sufficiently smaller than that of the substrate placement surface 31 are provided so as to be uniformly distributed in a portion surrounded by the annular projection 32 of the substrate placement surface 31. The columnar projections 33 and the annular projection 32 have an identical amount of projection from the substrate placement surface 31, and the upper end surfaces of not only the annular projection 32 but also the columnar projections 33 support the lower surface 2a of the substrate 2.

Figure 5B:
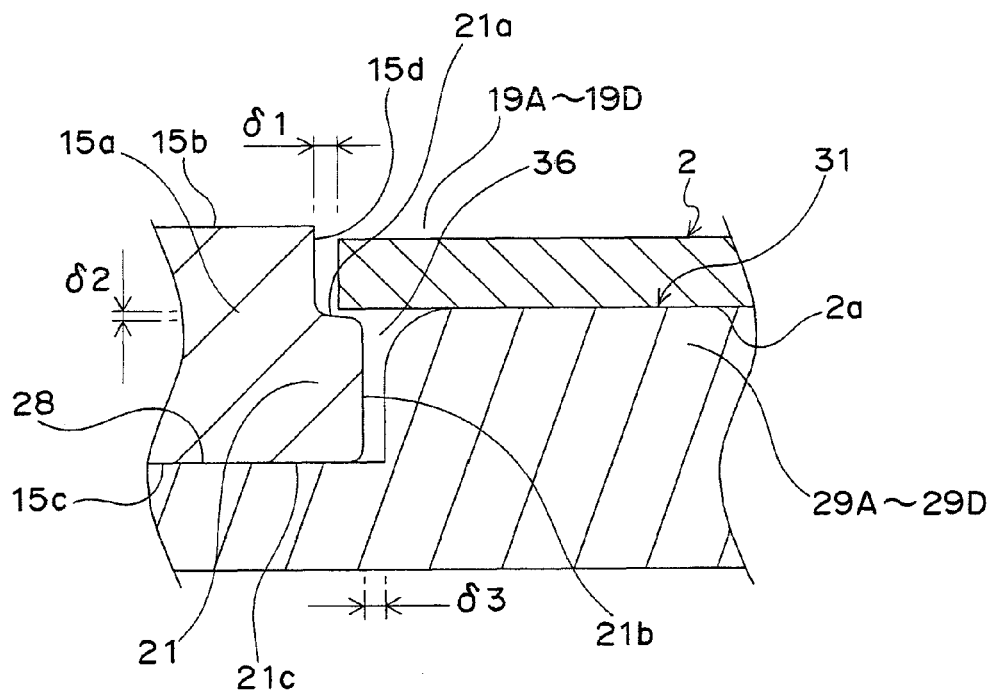
FIG. 5B is a partially enlarged sectional view of the tray and dielectric plate (after being placed on the tray)

Referring to FIGS. 5A and 5B, the substrate placement portions 29A through 29D have an outside diameter R1 set smaller than a diameter R2 of a circular opening 36 surrounded by a tip edge surface 21b of the substrate support portion 21. Therefore, when the tray 15 moves down toward the dielectric plate 23 during the loading, the respective substrate placement portions 29A through 29D enter the corresponding substrate accommodation holes 19A through 19D from the lower surface 15c side of the tray main body 15a, and then the lower surface 15c of the tray 15 is placed on the tray support surface 28 of the dielectric plate 23. Further, a height H1 of the upper surface 21a of the substrate support portion 21 from the lower surface 15c of the tray main body 15a is set lower than a height H2 of the substrate placement surface 31 from the tray support surface 28. Therefore, in a state in which the lower surface 15c of the tray 15 is placed on the tray support surface 28, the lower surface is pushed up by the substrate placement surface 31 at the upper end of each of the substrate placement portions 29A through 29D and floated above the substrate support portion 21 of the tray 15. In other words, when the tray 15 accommodating the substrates 2 in the substrate accommodation holes 19A through 19D is placed on the dielectric plate 23, the substrates 2 accommodated in the substrate accommodation holes 19A through 19D are respectively floated above the upper surface 21a of the substrate support portion 21, and the lower surface 2a is placed on the substrate placement surface 31.

Further, as shown in FIGS. 5A and 5B, a juncture between the outer peripheral surface 38 and the substrate placement surface 31 of each of the substrate placement portions 29A through 29D is chamfered with a round surface. Therefore, at the upper end side of the substrate placement portions 29A through 29D, the outer diameter of the substrate placement portions 29A through 29D increases from the substrate placement surface 31 side toward the tray support surface 28 when viewed from the penetration direction of the substrate accommodation holes 19A through 19D. On the other hand, on the lower end side of the outer peripheral surfaces 38 of the substrate placement portions 29A through 29D, the outside diameter, viewed from the direction of penetration, of the substrate accommodation holes 19A through 19D is constant.

Referring to FIG. 1, single-pole type electrostatic attraction electrodes 40 are embedded in the vicinity of the substrate placement surfaces 31 of the individual substrate placement portions 29A through 29D of the dielectric plate 23. These electrostatic attraction electrodes 40 are electrically insulated from each other, and a dc voltage for electrostatic attraction is applied from a common dc voltage applying mechanism 43 that has a dc power source 41 and a resistor 42 for adjustment.

Figure 6A:
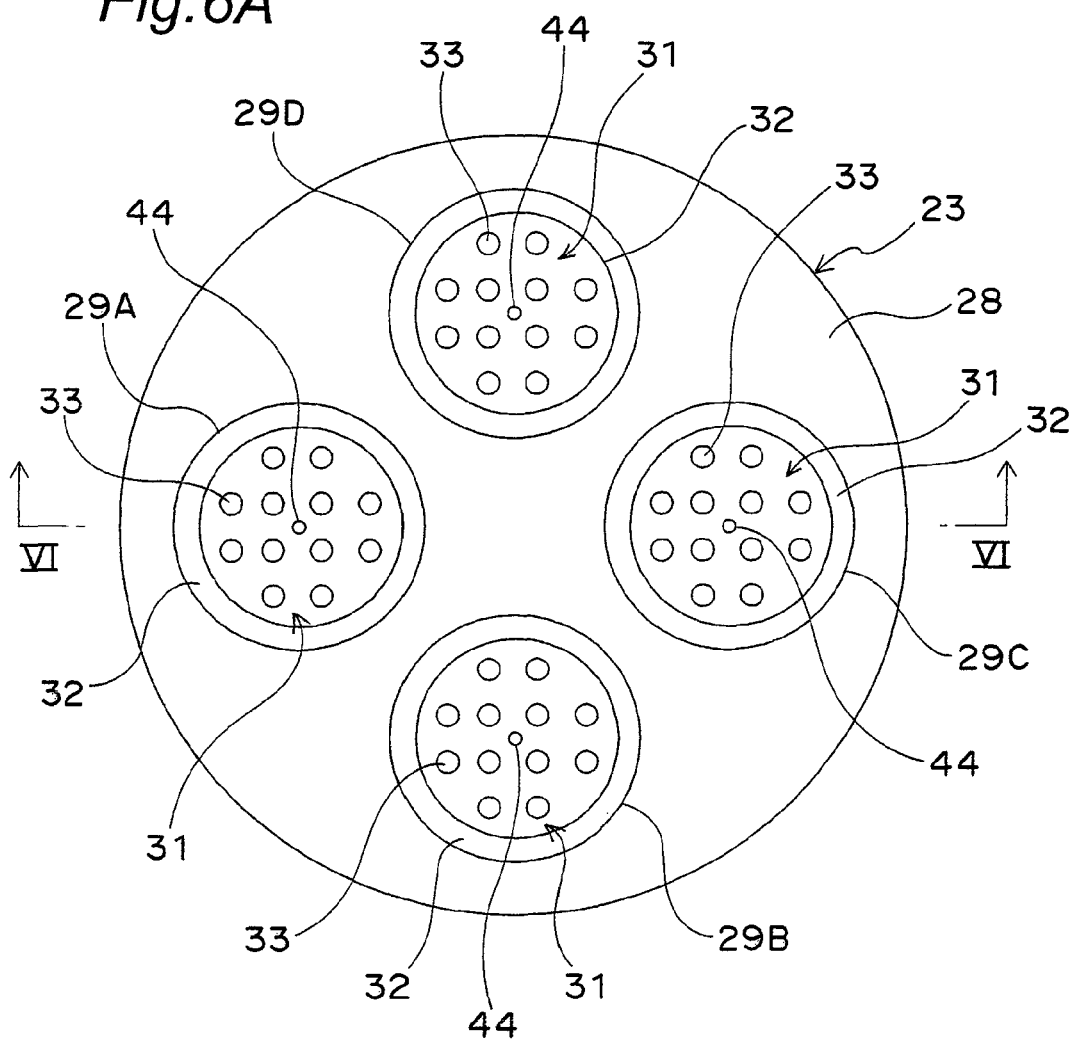
FIG. 6A is a plan view of the dielectric plate.
Figure 6B:
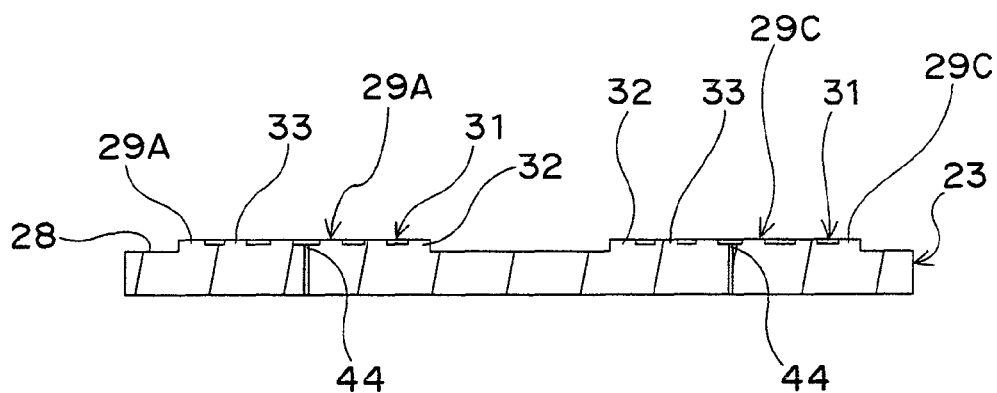
FIG. 6B is a sectional view taken along a line VI-VI of FIG. 6.

Referring to FIGS. 3, 6A and 6B, supply ports 44 of a heat conduction gas (helium in the present embodiment) are provided at the substrate placement surfaces 31 of the substrate placement portions 29A through 29D. These supply ports 44 are connected to a common heat conduction gas supply mechanism 45 (shown in FIG. 1). The heat conduction gas supply mechanism 45 has a heat conduction gas source (helium gas source in the present embodiment) 46, a flow passage 47 that reaches the supply ports 44 from the heat conduction gas source 46 as well as a flow meter 48, a flow control valve 49 and a pressure gauge 50, which are provided at the supply passage 47 in this order from the heat conduction gas source 46 side. Further, the heat conduction gas supply mechanism 45 has an exhaust passage 51 branched from the flow passage 47, and a cutoff valve 52 provided at the exhaust passage 51. Furthermore, the heat conduction gas supply mechanism 45 has a bypass passage 53 that connects the flow passage 47 at the supply port 44 side with respect to pressure gauge 50 and the exhaust passage 51. The heat conduction gas supply mechanism 45 supplies the heat conduction gas between the substrate placement surface 31 of each of the substrate placement portions 29A through 29D and the lower surface 2a of the substrate 2 placed on it, or specifically, into a closed space enclosed by the lower surface 2a of the substrate 2 and the annular projection 32. The cutoff valve 52 is closed while the heat conduction gas is supplied, so that the heat conduction gas is sent from the heat conduction gas supply source 46 via the supply passage 47 to the supply port 44. A controller 63 described later controls the flow control valve 49 on the basis of the flow rate and the pressure of the flow passage 47 detected by the flow meter 48 and the pressure gauge 50. On the other hand, the cutoff valve 52 is opened while the heat conduction gas is discharged, so that the heat conduction gas between the lower surface 2a of the substrate 2 and the substrate placement surface 31 is discharged from the exhaust port 54 via the supply port 44, the supply passage 47, and the exhaust passage 51.

A high-frequency applying mechanism 56 for applying a high frequency power as a bias voltage is electrically connected to the metal plate 24. The high-frequency applying mechanism 56 has a high-frequency power source 57 and a variable-capacitance capacitor 58 for matching.

Further, a cooling mechanism 59 for cooling the metal plate 24 is provided. The cooling mechanism 59 has a refrigerant passage 60 formed in the metal plate 24 and a refrigerant circulator 61 that circulates a temperature-controlled refrigerant in the refrigerant passage 60.

The controller 63, which is schematically shown only in FIG. 1, controls the operation of the whole dry etching apparatus 1 including the high-frequency power source 7, etching gas supply source 12, conveyance arm 16, evacuator 13, drive unit 17, dc voltage applying mechanism 43, heat conduction gas supply mechanism 45, high-frequency voltage applying mechanism 56, and cooling mechanism 59 on the basis of inputs from various sensors including the flow meter 48 and pressure gauge 50 as well as operational inputs.

A dry etching method using the dry etching apparatus 1 of the present embodiment is described.

First, substrates 2 are accommodated in the respective substrate accommodation holes 19A through 19D of the tray 1. The substrates 2 supported by the substrate support portions 21a of the tray 1 are exposed from the lower surfaces 15c of the tray main body 15a through the substrate accommodation holes 19A through 19D when viewed from the lower surface 15c side of the tray main body 15a.

Next, the tray 15 in which the substrates 2 are accommodated in the respective substrate accommodation holes 19A through 19D is supported by the conveyance arm 16 and loaded from the load dock chamber 10 into the chamber 3 through the gate 3a. As indicated by the two-dot chain line in FIG. 1, the tray 1 is placed above the substrate susceptor 9 with interposition of a clearance.

The elevation pin 18 driven by the drive unit 7 is moved up, and the tray 15 is transferred from the conveyance arm 16 to the upper end of the elevation pin 18. After the tray 15 is transferred, the conveyance arm 16 escapes to the load lock chamber 10, whereby the gate 3a is closed.

The elevation pin 18 supporting the tray 15 at its upper end moves down from the elevated position indicated by the two-dot chain line in FIG. 1 toward the substrate susceptor 9. Referring to FIGS. 5A and 5B, the lower surface 15c of the tray 15 moves down until the tray support surface 28 of the dielectric plate 23 of the substrate susceptor 9, whereby the tray 15 is supported on the tray support surface 28 of the dielectric plate 23. When the tray 15 is moved down toward the tray support surface 28, the substrate placement portions 29A through 29D of the dielectric plate 23 enter the corresponding substrate accommodation holes 19A through 19D of the tray 15 from the lower surface 15c side of the tray 15. As the lower surface 15c of the tray 15 approaches the tray support surface 28, the substrate placement surfaces 31 at the tip edges of the substrate placement portions 29A through 29D advance in the substrate accommodation holes 19A through 19D toward the upper surface 15b of the tray 15. As shown in FIG. 5B, when the lower surface 15c of the tray 15 is placed on the tray support surface 28 of the dielectric plate 23, the substrates 2 in the respective substrate accommodation holes 19A through 19D are each lifted from the upper surface 21a of the substrate support portion 21 by the substrate placement portions 29A through 29D. Specifically, the lower surfaces 2a of the substrates 2 are placed on the substrate placement surfaces 31 of the substrate placement portions 29A through 29D, thereby being placed above the upper surfaces 21a of the substrate support portions 21 of the tray 15 with interposition of a space.

With the substrate placement portions 29A through 29D thus entering the substrate accommodation holes 19A through 19D of the tray 15, the substrates 2 are placed on the substrate placement surfaces 31. Therefore, the four substrates 2 accommodated in the tray 15 are all placed on the substrate placement surfaces 31 of the substrate placement portions 29A through 29D with high positioning accuracy. Further, since the juncture between the outer peripheral surface 38 and the substrate placement surface 31 of each of the substrate placement portions 29A through 29D is chamfered with a round surface as described above, the chamfered portions of the substrate placement portions 29A through 29D come in contact with the tip edge surfaces 21b of the substrate support portions 21 even if a minute positional deviation exists between the substrate accommodation holes 19A through 19D and the substrate placement portions 29A through 29D in plan view. As a result, the substrate placement portions 29A through 29D are inserted smoothly and reliably into the substrate accommodation holes 19A through 19D. This also contributes to that the substrates 2 are placed on the substrate placement surfaces 31 with high positioning accuracy.

Next, the dc voltage is applied from the dc voltage applying mechanism 43 to the electrostatic attraction electrodes 40 embedded in the dielectric plate 23, whereby the substrates 2 are electrostatically attracted to the substrate placement surfaces 31 of the substrate placement portions 29A through 29D. The lower surfaces 2a of the substrates 2 are placed directly on the substrate placement surfaces 31 without interposition of the tray 15. Therefore, the substrates 2 are retained on the substrate placement surfaces 31 with high degree of adhesion.

The heat conduction gas is then supplied from the heat conduction gas supply unit 45 through the supply ports 44 into spaces surrounded by the annular projections 32 of the substrate placement portions 29A through 29D and the lower surfaces 2a of the substrates 2 so as to fill the spaces with the heat conduction gas.

Subsequently, the etching gas is supplied from the etching gas supply source 12 into the chamber 3, and the inside of the chamber 3 is maintained at a predetermined pressure by the evacuator 13. The high-frequency voltage is then applied from the high-frequency power source 7 to the ICP coil 5, and the bias voltage is applied to the metal plate 24 of the substrate susceptor 9 by the high-frequency applying mechanism 56 to generate plasma in the chamber 3. The substrates 2 are etched by the plasma. Since the four substrates 2 can be placed on the substrate susceptor 9 by one tray 15, batch processing can be performed.

During the etching, the metal plate 24 is cooled by circulating a refrigerant in the refrigerant passage 60 by means of the refrigerant circulator 61, whereby the dielectric plate 23 and the substrates 2 retained on the substrate placement surfaces 31 of the dielectric plate 23 are cooled. As described above, the substrates 2 have their lower surfaces 2a placed directly on the substrate placement surfaces 31 without interposition of the tray 15 and retained with high degree of adhesion. Therefore, the spaces surrounded by the annular projections 32 and the lower surfaces 2a of the substrates 2 and filled with the heat conduction gas have high airtight level. This achieves the sufficient thermal conductivity between the substrates 2 and the substrate placement surfaces 31 via the heat conduction gas. As a result, the substrates 2 retained on the substrate placement surfaces 31 of the individual substrate placement portions 29A through 29D can be cooled with high cooling efficiency, and the temperature of the substrates 2 can be controlled with high accuracy. Further, the spaces enclosed by the annular projections 32 of the substrate placement portions 29A through 29D and the lower surfaces 2a are filled with the heat conduction gas every individual substrate 2. In other words, the spaces filled with the heat conduction gas differ for respective substrate 2. This also contributes to that the thermal conductivity between the individual substrates 2 and the substrate placement surfaces 31 of the dielectric plate 23 is sufficient, and that temperature can be controlled with high cooling efficiency and high accuracy.

As described above, since the substrates 2 are placed directly on the substrate placement surfaces 31 of the individual substrate placement portions 29A through 29D and electrostatically attracted, the degree of adhesion to the substrate placement surfaces 31 is high. Therefore, the member such as a clamp ring for mechanically pressurizing the outer peripheral edge portion of the upper surface of the substrate 2 with respect to the dielectric plate 23 is unnecessary. In other words, there is no member that causes the instability of the state of the plasma not only in the center portion but also in the vicinity of the outer peripheral edge on the upper surface of the substrate 2. Therefore, uniform plasma processing can be achieved in the entire region of the surface of the substrate 2 including the vicinity of the outer peripheral edge.

In order to prevent ingression of the plasma to the lower surface 2a side of the substrate 2 during the etching process while securing the positioning accuracy of the substrate 2 with respect to the substrate placement surface 31, it is preferred that a clearance δ1 between the outer peripheral edge of the substrate 2 and the hole wall 15d of each of the substrate accommodation holes 19A through 19D of the tray 15 is approximately 0.1 to 0.2 mm, a clearance δ2 between the lower surface 2a of the substrate 2 and the upper surface 21a of the substrate support portion 21 is approximately 0.2 to 0.3 mm, and a clearance δ3 between the sidewall of each of the substrate placement portions 29A through 29D and the tip edge of the substrate support portion 21 is approximately 0.5 mm.

After completion of the etching, the application of the high-frequency voltage from the high-frequency power source 7 to the ICP coil 5 and the application of the bias voltage from the high-frequency applying mechanism 56 to the metal plate 24 are stopped. Subsequently, the etching gas is discharged from the chamber 3 by the evacuator 13. Further, the heat conduction gas is discharged from the substrate placement surface 31 and the lower surface 2a of the substrate 2 by the heat conduction gas supply mechanism 45. Furthermore, the application of the dc voltage from the dc voltage applying mechanism 43 to the electrostatic attraction electrode 40 is stopped to release the electrostatic attraction of the substrate 2.

Next, the elevation pin 18 is moved up by the drive unit 17. When the elevation pin 18 is moved up, the lower surface 15c of the tray 15 is pushed up by the upper end and floated from the tray support surface 28 of the dielectric plate 23. When the tray 15 is further moved up with the elevation pin 18, the lower surface 2c of the substrate 2 is pushed up by the substrate support portion 21 of the tray 15 as shown in FIG. 5A, and the substrate 2 is floated from the substrate placement surface 31 of each of the substrate placement portions 29A through 29D. The elevation pin 18 is moved up to the elevated position as indicated by the two-dot chain line in FIG. 1.

Subsequently, the tray 15 is transferred to the conveyance arm 16 that has entered the chamber 3 from the load dock chamber 10 through the gate 3a. The tray 15 is unloaded to the load dock chamber 10 by the conveyance arm 16.

FIGS. 7 through 10 show various alternatives concerning the substrate support portion 21 of the tray 15 and the substrate placement portion 4 of the dielectric plate 23.

Figure 7:
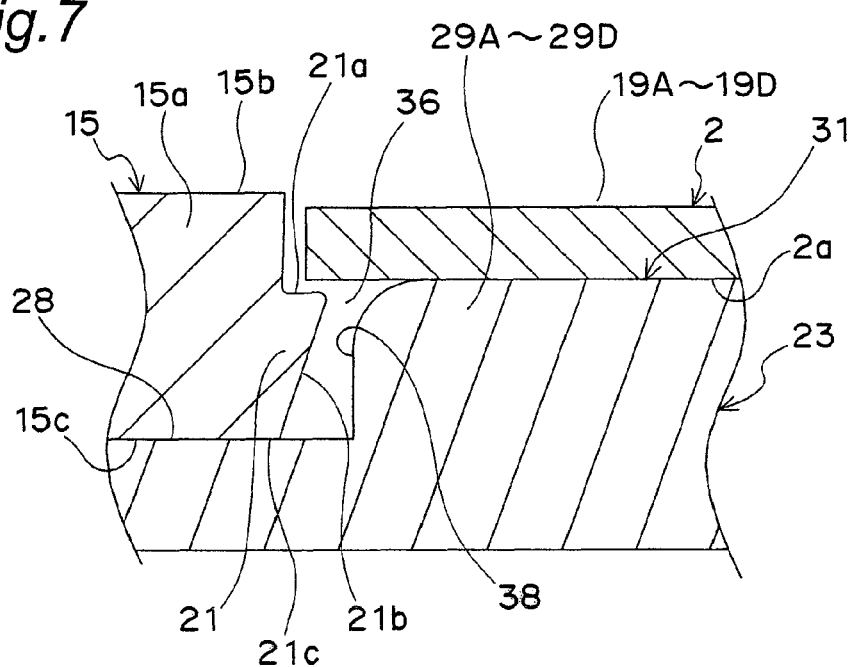
FIG. 7 is a partially enlarged sectional view of a first alternative of the tray and dielectric plate.

In the example of FIG. 7, the juncture between the outer peripheral surface 38 and the substrate placement surface 31 of each of the substrate placement portions 29A through 29D is chamfered with a round surface, and the tip edge surface 21b of the substrate support portion 21 of the tray 15 is also a tapered surface such that the amount of projection from the hole wall 15d is increased from the lower surface 15c side toward the upper surface 15b side of the tray 15. By the tip edge surface 21b of the substrate support portion 21 being such tapered surface, the substrate placement portions 29A through 29D can be inserted more reliably and smoothly into the substrate accommodation holes 19A through 19D even when a minute positional deviation exists between the substrate accommodation holes 19A through 19D and the substrate placement portions 29A through 29D in plan view.

Figure 8:
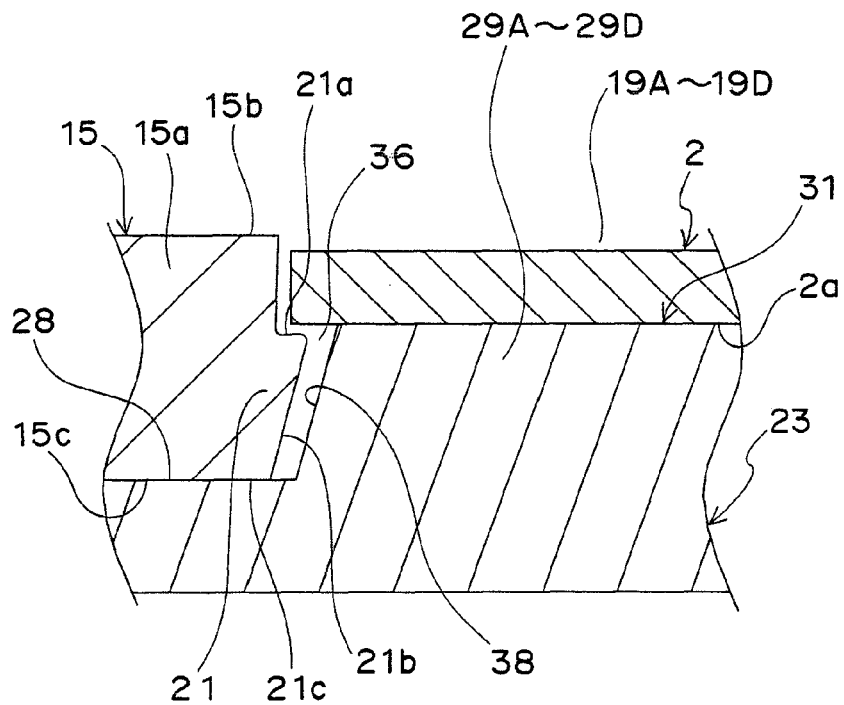
FIG. 8 is a partially enlarged sectional view of a second alternative of the tray and dielectric plate.

In the example of FIG. 8, the outer peripheral surface 38 of each of the substrate placement portions 29A through 29D is a tapered surface such that the outside diameter dimension is increased from the substrate placement surface 31 side toward the tray support portion 21. Further, the tip edge surface 21b of the substrate support portion 21 of the tray 15 is a tapered surface such that the amount of projection from the hole wall 15d is increased from the lower surface 15c side toward the upper surface 15b side of the tray 15. Also by both the outer peripheral surface of each of the substrate placement portions 29A through 29D and the tip edge surface 21b of the substrate support portion 21 being such tapered surfaces, the substrate placement portions 29A through 29D can be inserted more reliably and smoothly into the substrate accommodation holes 19A through 19D.

Figure 9:
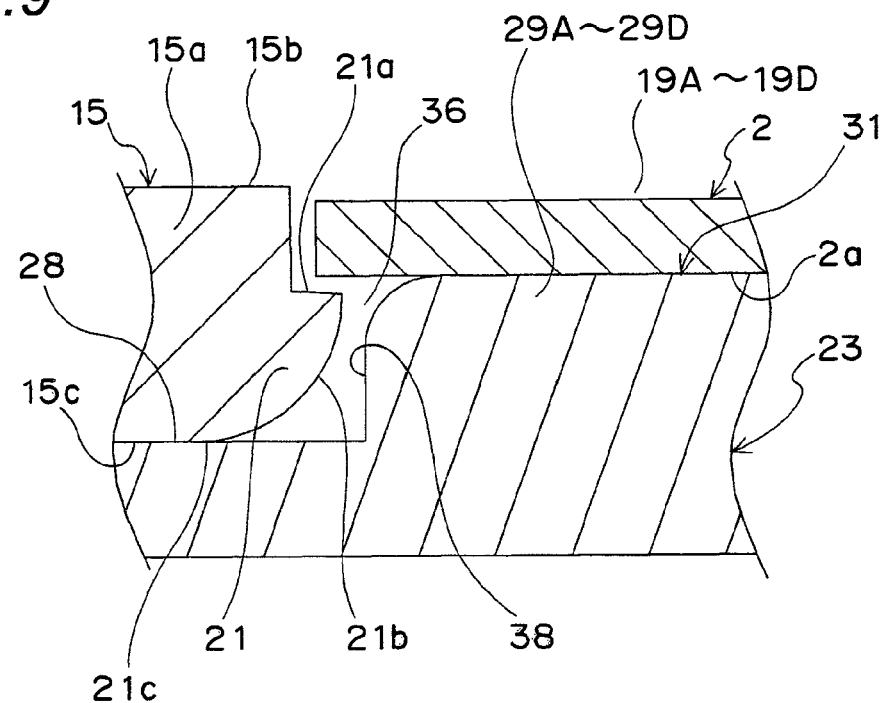
FIG. 9 is a partially enlarged sectional view of a third alternative of the tray and dielectric plate.
Figure 10:
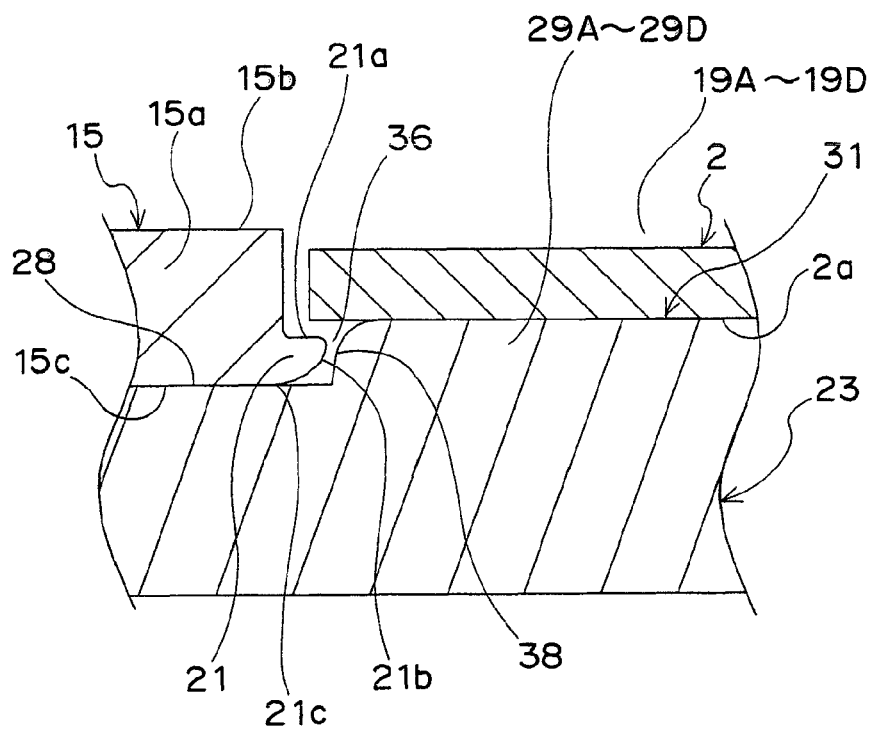
FIG. 10 is a partially enlarged sectional view of a fourth alternative of the tray and dielectric plate.
Figure 11:
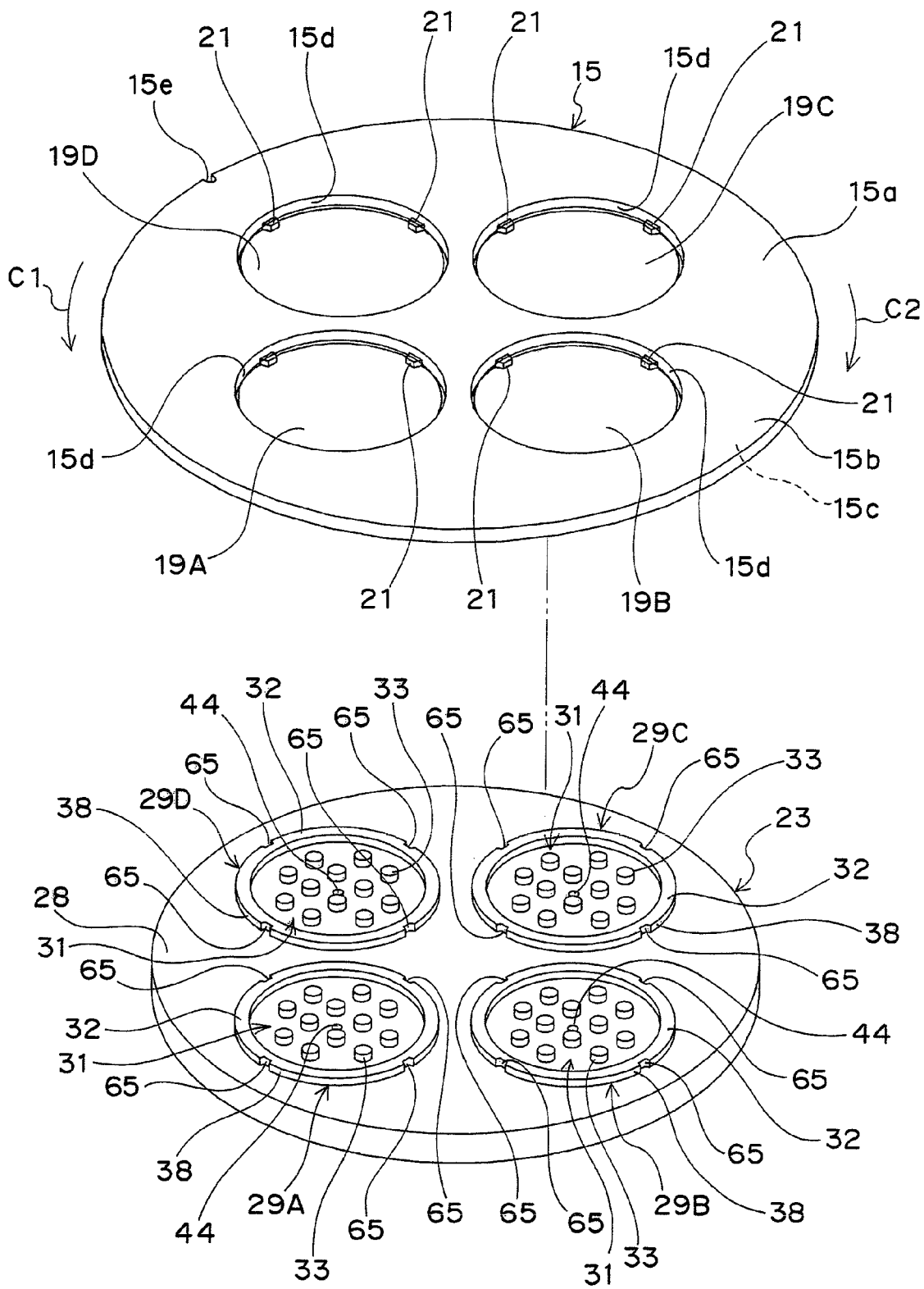
FIG. 11 is a sectional view showing a tray and dielectric plate provided for a dry etching apparatus according to a second embodiment of the present invention.
Figure 12A:
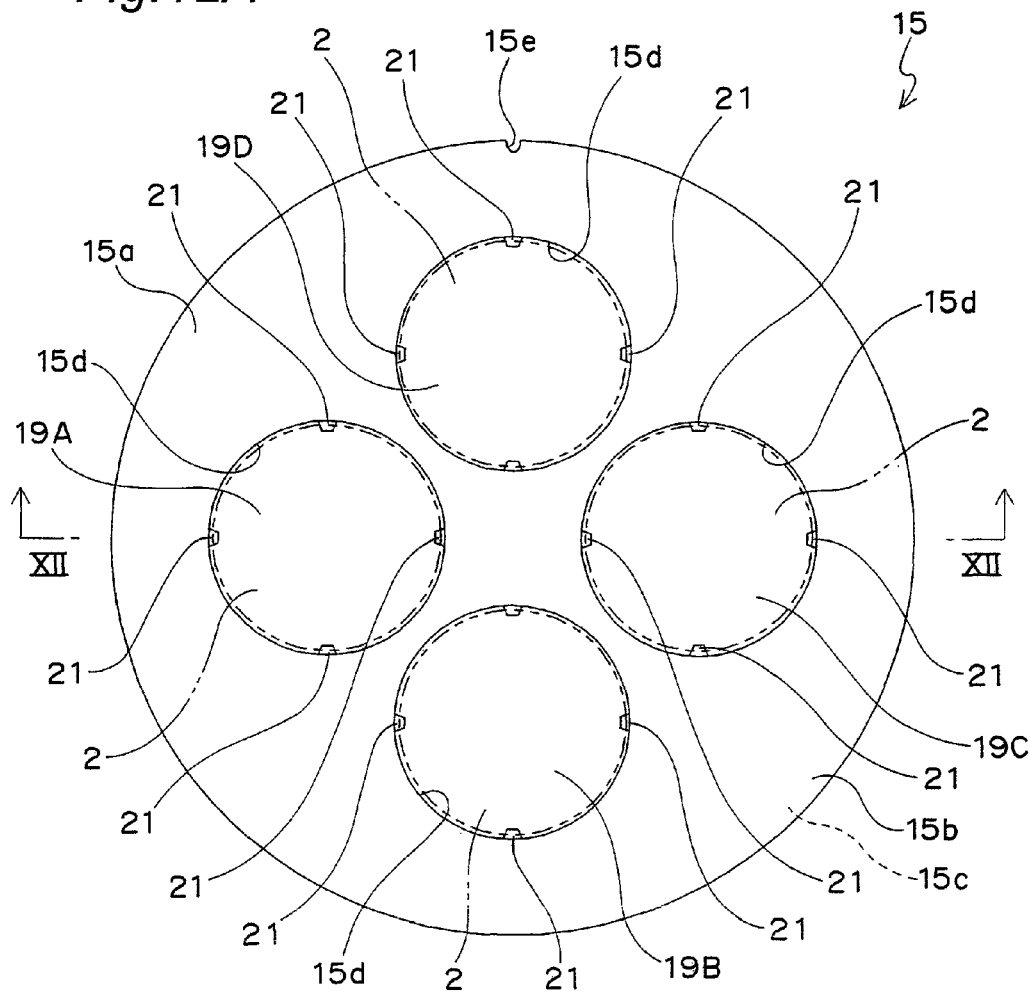
FIG. 12A is a plan view of the tray.
Figure 12B:
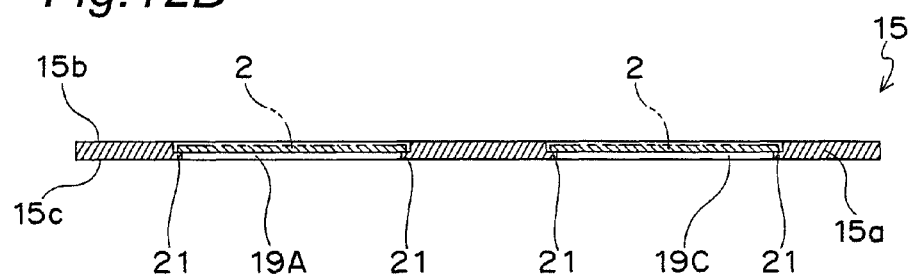
FIG. 12B is a sectional view taken along a line XII-XII of FIG. 12A.
Figure 13A:
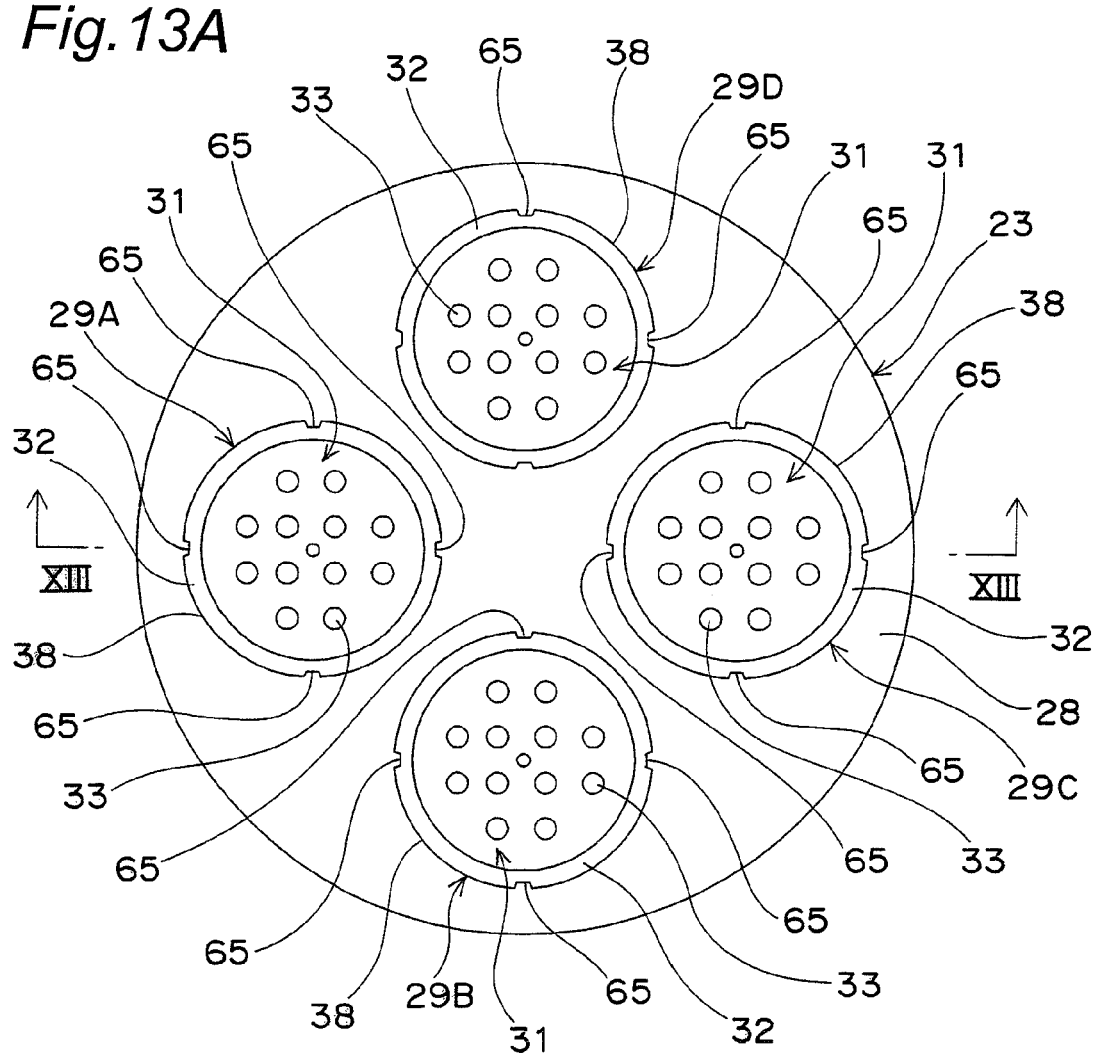
FIG. 13A is a plan view of the dielectric plate.
Figure 13B:
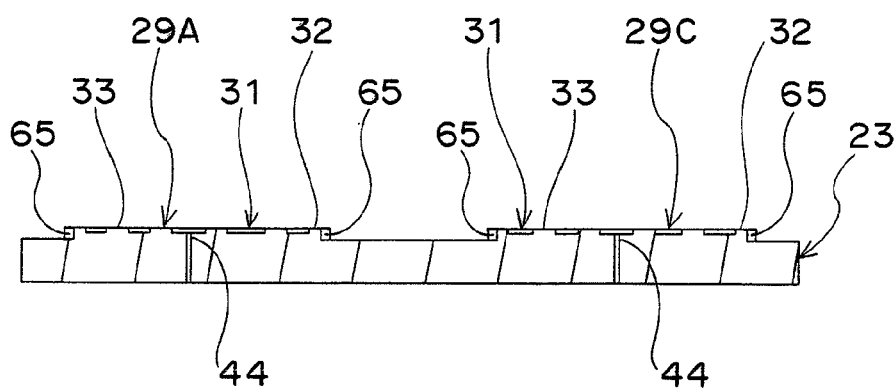
FIG. 13B is a sectional view taken along a line XIII-XIII of FIG. 13.

In the examples of FIGS. 9 and 10, the juncture between the outer peripheral surface 38 and the substrate placement surface 31 of each of the substrate placement portions 29A through 29D is chamfered with a round surface, and the tip edge surface 21b of the substrate support portion 21 is also a circular arc-shaped surface such that the amount of projection from the hole wall 15d is increased from the lower surface 15c side toward the upper surface 15b side of the tray 15. In the example of FIG. 9, the radius of curvature of the circular arc that constitutes the tip end surface 21a is set comparatively large, and a height from the lower surface 21c of the substrate support portion 21 to the upper surface 21a is set large. On the other hand, in the example of FIG. 10, the radius of curvature of the circular arc that constitutes the tip edge surface 21b is set comparatively small, and the height of the substrate support portion 21 is set small.

In the first embodiment (FIGS. 5A and 5B) and the various alternatives shown in FIGS. 7 through 10, the surface of either one or both of the tip edge surface 21b of the substrate support portion 21 and the outer peripheral surfaces 38 of the substrate placement portions 29A through 29D may be coated with a relatively hard material like yttria. Providing such a coating enables the prevention of the generation of dust due to a contact of the substrate support portion 21 of the tray 15 with the substrate placement portions 29A through 29D of the dielectric plate 23 when the tray 15 is placed on the dielectric plate 23 or when the tray 15 is unloaded from the dielectric plate 23.

(Second Embodiment)

A second embodiment of the present invention shown in FIGS. 11 through 13B differs from the first embodiment in the structures of the tray 15 and the dielectric plate 23 of the substrate susceptor 9.

Four projecting substrate support portions 21 are provided at intervals in the circumferential direction on the lower surface 15c side of the hole wall 15d of each of the substrate accommodation holes 19A through 19D formed in the tray main body 15a. Specifically, the four substrate support portions 21 are provided at equiangular intervals (intervals of 90°) with respect to the center of the substrate accommodation holes 19A through 19D when viewed from the direction of penetration of the substrate accommodation holes 19A through 19D. On the other hand, four receiving grooves 65 that extend from the substrate placement surface 31 toward the tray support surface 28 are formed on the outer peripheral surface 38 of each of the substrate placement portions 29A through 29D of the dielectric plate 23. In plane view, four receiving grooves 65 are provided at equiangular intervals with respect to the center of each of the substrate placement portions 29A through 29D. The dimension and shape in plan view of the receiving groove 65 are set slightly larger than that of the projecting substrate support portion 21.

When the substrate accommodation holes 19A through 19D of the tray 15 are respectively located above the substrate placement portions 29A through 29D of the dielectric plate 23, the four substrate support portions 21 of each of the substrate accommodation holes 19A through 19D are slid into the receiving grooves 65 of the corresponding substrate placement portions 29A through 29D when the tray 15 is moved down toward the dielectric plate 23. Therefore, in this case, the tray 15 can be moved down until the lower surface 15c of the tray 15 reaches the tray support surface 28 and the lower surface 2a of the substrate 2 is placed on the substrate placement surface 31. However, when the angle of the tray 15 itself deviates relatively largely around its center as indicated by arrows C1 and C2 in FIG. 11, the substrate support portions 21 deviate in position with respect to the receiving grooves 56 in plan view. Therefore, the substrate support portions 21 are not slid into the receiving grooves 65 and interfere with the substrate placement portions 29A through 29D. As a result, the entry of the substrate placement portions 29A through 29D into the substrate accommodation holes 19A through 19D is disturbed. Therefore, by providing the projecting substrate support portions 21 and the receiving grooves 65 arranged at intervals in the circumferential direction, the positioning accuracy of the substrate 2 with respect to the substrate placement surface 31 of the dielectric plate 23 is further improved.

Since other constructions and operations of the second embodiment are similar to those of the first embodiment, same elements are denoted by same reference numerals and descriptions are omitted.

Figure 14:
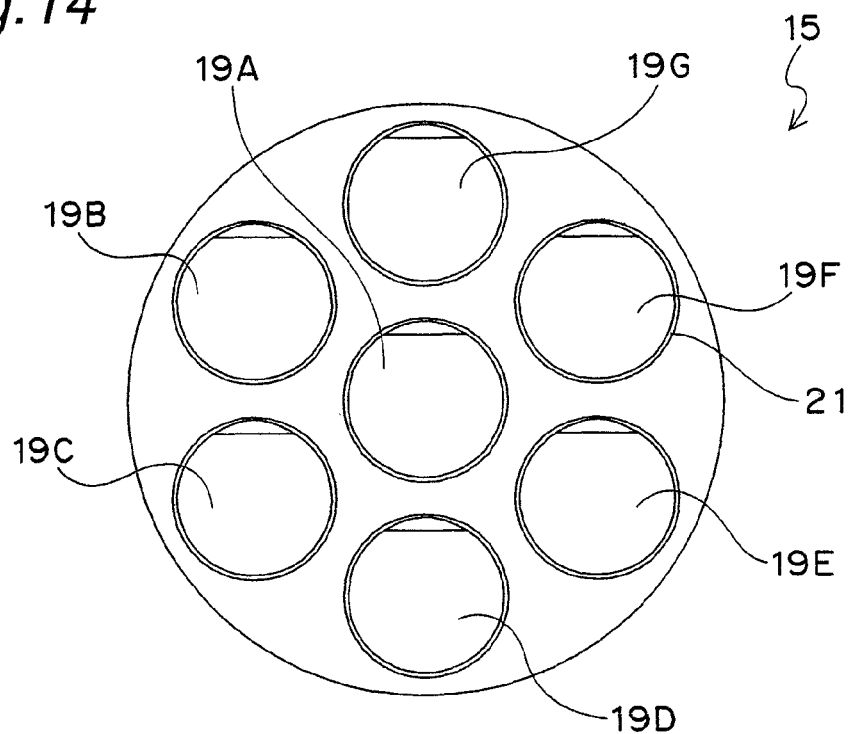
FIG. 14 is a plan view showing a first alternative of the tray.
Figure 15:
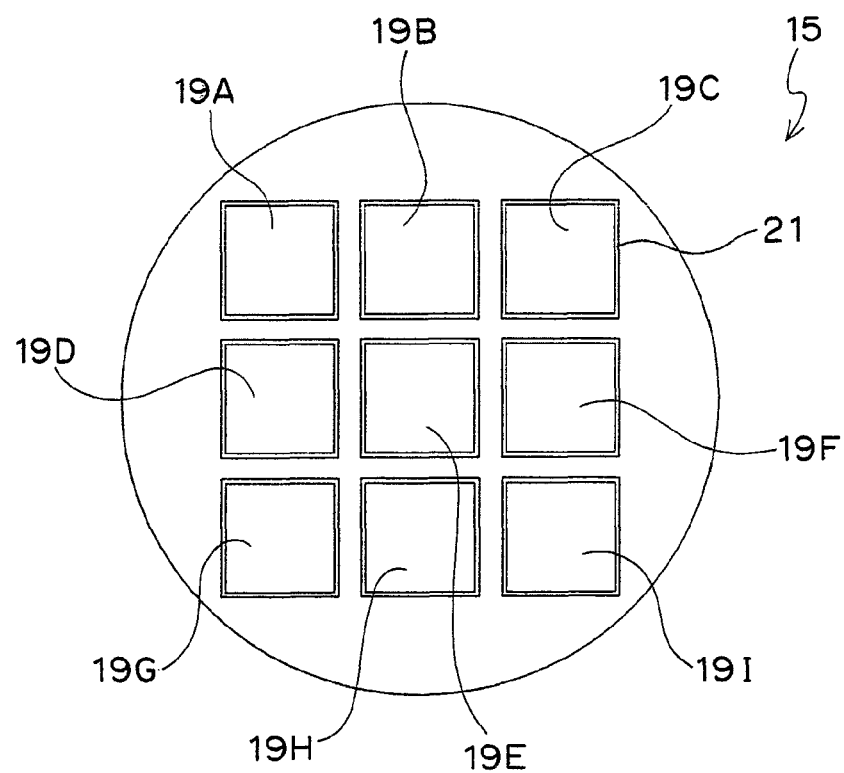
FIG. 15 is a plan view showing a second alternative of the tray.

FIGS. 14 and 15 show various alternatives of the tray 15. In the example of FIG. 14, seven substrate accommodation holes 19A through 19G respectively for accommodating a substrate having an orientation flat of which an outer peripheral edge is partially linearly cut are formed at the tray main body 15a. The hole walls 15d of the substrate accommodation holes 19A through 19G have a cylindrical surface similar to that of the first embodiment, but they are partially formed into a flat surface corresponding to the orientation flat. In the example of FIG. 15, nine substrate accommodation holes 19A through 19I respectively for receiving a rectangular substrate on the tray main body 15a are formed. Without being limited to FIGS. 14 and 15, the shape and number of the substrate accommodation holes of the tray 15 can also be variously set in accordance with the shape and number of substrates to be accommodated. Further, the shape and number of the substrate placement portions provided at the dielectric plate 23 of the substrate susceptor 9 can also be variously set in accordance with the shape and number of the substrate accommodation holes.

(Third Embodiment)

Figure 16:
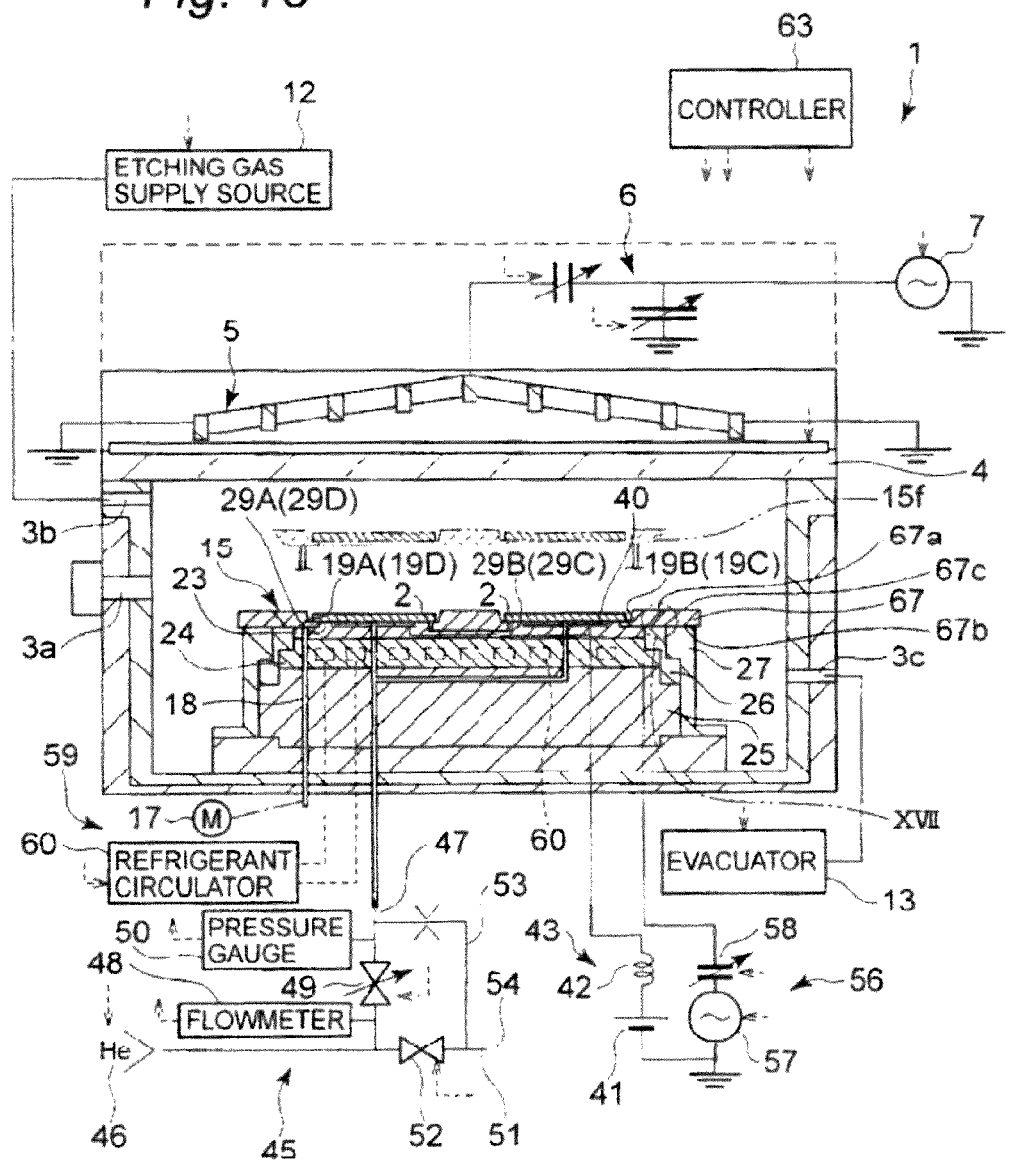
FIG. 16 is a schematic sectional view showing a dry etching apparatus according to a third embodiment of the present invention.

The third embodiment of the present invention shown in FIG. 16 has an annular guide plate 67 for positioning the tray 15 to the dielectric plate 23. The guide plate 67 is fixed to the upper surface of the guide cylinder body 26 and surrounds the four substrate placement portions 29A through 29D of the dielectric plate 23. An inner peripheral surface 67a of the guide plate 67 is a tapered surface that expands from a lower surface 67b toward an upper surface 67c. Further, the thickness of the guide plate 67 is set approximately equal to the thickness of the tray 15.

Figure 17:
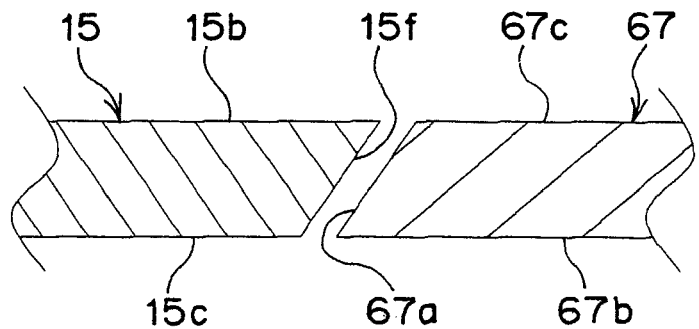
FIG. 17 is a partially enlarged view of a portion XVII of FIG. 16.

With reference also to FIG. 17, according to the present embodiment, an outer peripheral surface 15f of the tray 15 is a tapered surface of which outside diameter is enlarged from the lower surface 15c toward the upper surface 15b. The dimensions and shapes including the taper degrees of the inner peripheral surface 67a of the guide plate 67 and the outer peripheral surface 15f of the tray 15 are set so that the outer peripheral surface 15f of the tray 15 is and guided to be arraigned by the inner peripheral surface 67a of the guide plate 67 when the lower surface 15c of the tray 15 is placed on the tray support surface 28.

In FIG. 16, when the tray 15 moves down from the elevated position indicated by the two-dot chain line in FIG. 16 toward the dielectric plate 23, the outer peripheral surface 15f of the tray 15 is guided by the inner peripheral surface 67a of the guide plate 67. By inserting the substrate placement portions 29A through 29D into the substrate accommodation holes 19A through 19F of the tray 15, the substrates 2 in the substrate accommodation holes 19A through 19D are arraigned with respect to the substrate placement surfaces 31 of the dielectric plate 23, and the tray 15 itself that retains the substrates 2 is also arraigned with respect to the dielectric plate 23 by the guide plate 67. As a result, the positioning accuracy of the substrate 2 with respect to the substrate placement surface 31 of the dielectric member 23 is further improved.

Figure 18A:
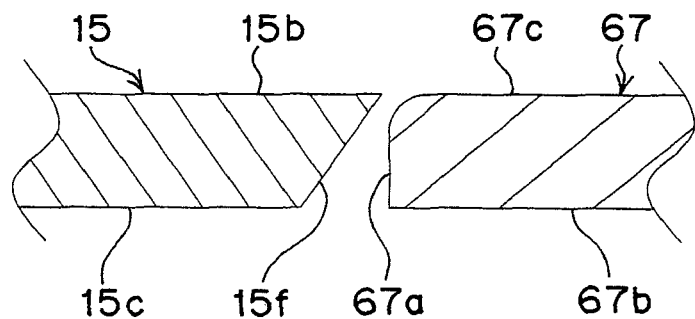
FIG. 18A is a partially enlarged sectional view showing a first alternative of the tray and guide plate.
Figure 18B:
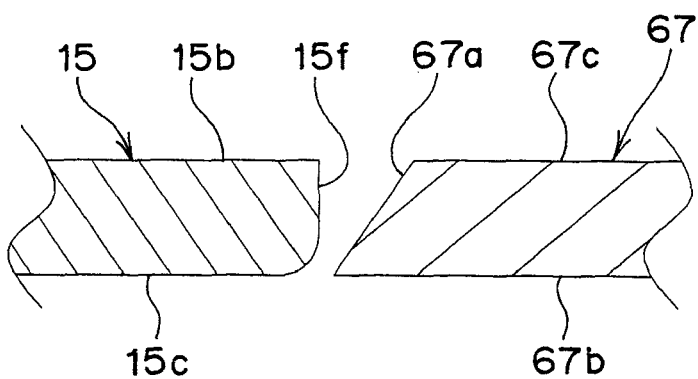
FIG. 18B is a partially enlarged sectional view showing a second alternative of the tray and guide plate.

FIGS. 18A and 18B show alternatives of the tray 15 and the guide plate 67. In the example of FIG. 18A, the outer peripheral surface 15f of the tray 15 is a tapered surface of which outside diameter is enlarged from the lower surface 15c toward the upper surface 15b, whereas the inner peripheral surface 67a of the guide plate 67 is a flat surface that extends in a perpendicular direction with a chamfered round surface located at the juncture with the upper surface 67b. On the other hand, in the example of FIG. 18B, the outer peripheral surface 15f of the tray 15 is a flat surface that extends in the perpendicular direction with a chamfered round surface located at the juncture with the lower surface 15c, whereas the inner peripheral surface 67a of the guide plate 67 is a tapered surface of which outside diameter extends from the lower surface 67b toward the upper surface 67a. The positioning accuracy with respect to the dielectric plate 23 of the tray 15 can be further improved by combinations of the shapes of the outer peripheral surface 15f of the tray 15 and the inner peripheral surface 67a of the guide plate 67 shown in FIGS. 18A and 18B are adopted. It is noted that the outer peripheral surface 15f of the tray 15 and the inner peripheral surface 67a of the guide plate 67 are not limited to the round surface but allowed to be chamfered with an angled surface.

Since other constructions and operations of the third embodiment are similar to those of the first embodiment, same elements are denoted by same reference numerals and descriptions are omitted.

(Fourth Embodiment)

Figure 19:
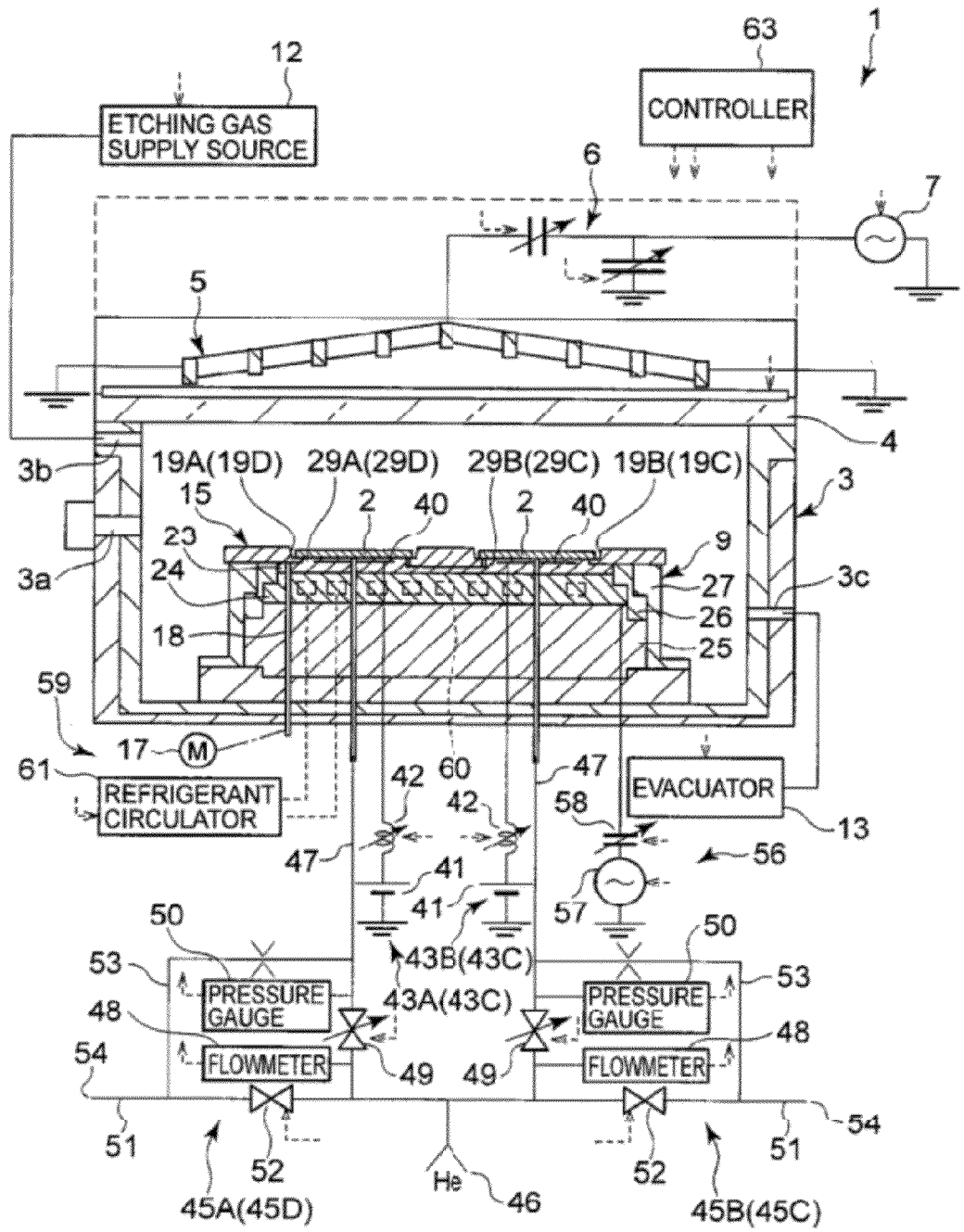
FIG. 19 is a schematic sectional view showing a dry etching apparatus according to a fourth embodiment of the present invention.

In the fourth embodiment of the present invention shown in FIG. 19, the dry etching apparatus 1 has heat conduction gas supply mechanisms 45A through 45D respectively for four substrate placement portions 29A through 29D provided for one common dielectric member 4. The heat conduction gas supply mechanisms 45A through 45D have a common heat conduction gas source 46. However, the flow passage 47, flow meter 48, flow control valve 49, pressure gauge 50, exhaust passage 51, cutoff valve 52, bypass passage 53, and exhaust port 54 are provided separately for each of the individual heat conduction gas supply mechanisms 45A through 45D. Therefore, the individual heat conduction gas supply mechanisms 45A through 45D are able to individually control the supply and discharge of the heat conduction gas between the substrate placement surfaces 31 and the substrates 2. The supply of the heat conduction gas between the substrate placement surfaces 31 and the substrates 2 can be adjusted individually for each of the four substrates 2 placed on the four substrate placement portions 29A through 29D. As a result, the cooling efficiency of the substrate 2 and the control accuracy of the substrate temperature are further improved, resulting in that the etching accuracy can be improved.

Further, the dry etching apparatus 1 has individually controllable dc voltage applying mechanisms 43A through 43D for the four electrostatic attraction electrodes 40 embedded in the substrate placement portions 29A through 29D. Each of the dc voltage applying mechanisms 43A through 43D has a dc power source 41 and a resistor 42 for adjustment. Since the dc voltages applied to the electrostatic attraction electrodes 40 embedded in the respective substrate placement portions 29A through 29D can be individually controlled, the electrostatic attraction forces of the four substrates 2 placed on the substrate placement surfaces 31 of the four substrate placement portions 29A through 29D can be uniformed by eliminating variations.

Since other constructions and operations of the fourth embodiment are similar to those of the first embodiment, same elements are denoted by same reference numerals and descriptions are omitted.

(Fifth Embodiment)

Figure 20:
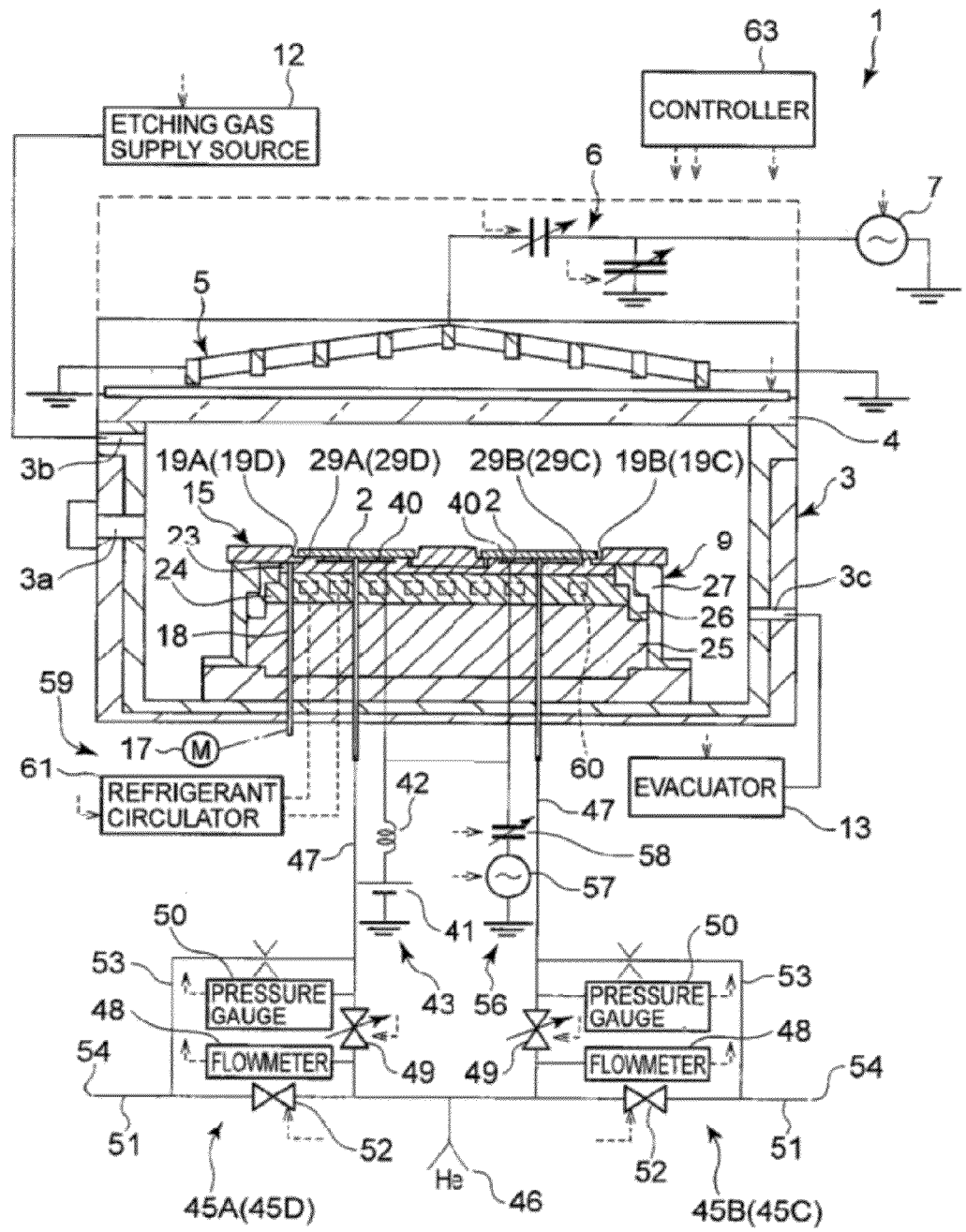
FIG. 20 is a schematic sectional view showing a dry etching apparatus according to a fifth embodiment of the present invention.

In the dry etching apparatus 1 of the fifth embodiment of the present invention shown in FIG. 20, the high-frequency applying mechanism 56 is not the metal plate 24 but electrically connected to the electrostatic attraction electrodes 40 embedded in the four substrate placement portions 29A through 29D of the dielectric member 4. The high-frequency applying mechanism 56 applies a high frequency as a bias voltage superimposed on the dc voltage for electrostatic attraction applied by the dc voltage applying mechanism 43 to each of the electrostatic attraction electrodes 40. By applying the bias voltage not to the metal plate 24 but to the electrostatic attraction electrodes 40, the wastage of the tray 15 can be reduced. Further, as in the fourth embodiment, individually controllable heat conduction gas supply mechanisms 45A through 45D are provided for each of the individual substrate placement portions 29A through 29D.

Since other constructions and operations of the fifth embodiment are similar to those of the first embodiment, same elements are denoted by same reference numerals and descriptions are omitted.

(Sixth Embodiment)

Figure 21:
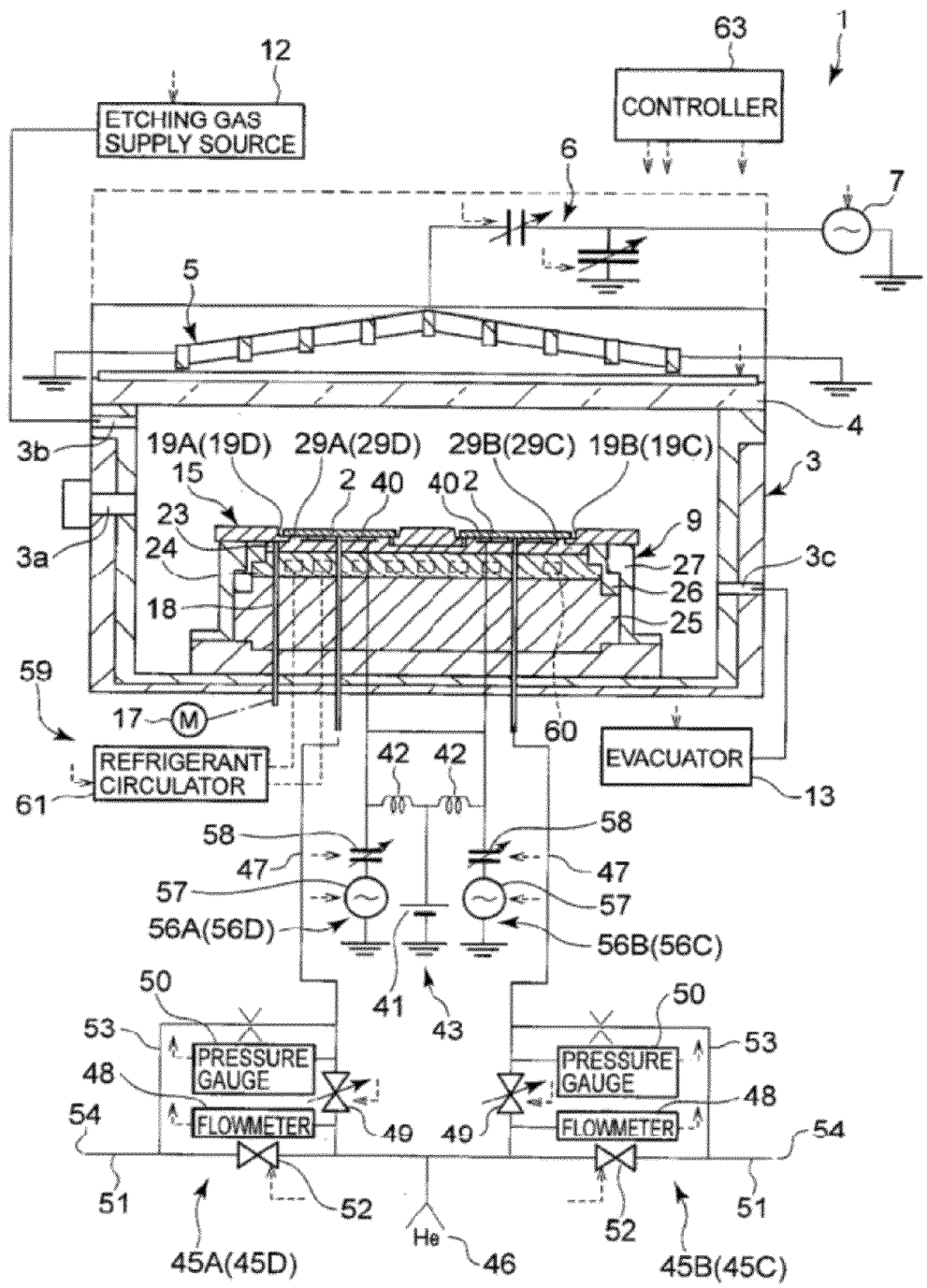
FIG. 21 is a schematic sectional view showing a dry etching apparatus according to a sixth embodiment of the present invention.

In the dry etching apparatus 1 of the sixth embodiment of the present invention shown in FIG. 21, high-frequency applying mechanisms 56A through 56D are provided. The high-frequency applying mechanisms 56A through 56D apply a high frequency as a bias voltage to the electrostatic attraction electrodes 40 embedded in the respective substrate placement portions 29A through 29D so as to be superimposed on the dc voltage for electrostatic attraction applied by the dc voltage applying mechanism 43. The high-frequency applying mechanisms 56A through 56D each have a high-frequency power source 57 and a variable-capacitance capacitor 58 and are individually controllable. Since the power of the high frequency applied as the bias voltage to the electrostatic attraction electrodes 40 can be adjusted in accordance with the characteristics of the four substrates 2 placed on the substrate placement surfaces 31 of the four substrate placement portions 29A through 29D, a uniform etching process can be achieved without variations among the four substrates 2.

Since other constructions and operations of the sixth embodiment are similar to those of the first embodiment, same elements are denoted by same reference numerals and descriptions are omitted.

(Seventh Embodiment)

Figure 22:
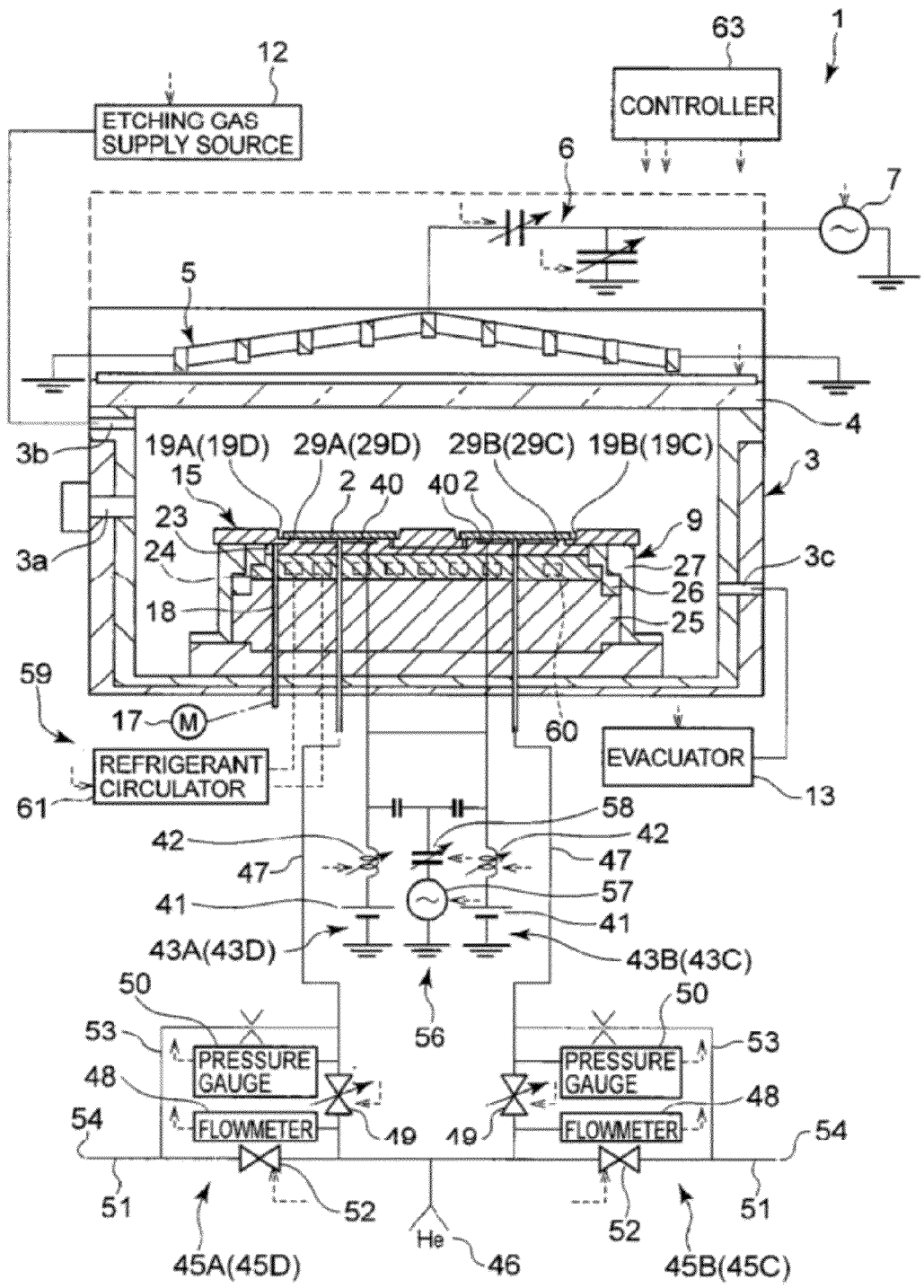
FIG. 22 is a schematic sectional view showing a dry etching apparatus according to a seventh embodiment of the present invention.

The dry etching apparatus 1 of the seventh embodiment of the present invention shown in FIG. 22 has individually controllable dc voltage applying mechanisms 43A through 43D for each of the electrostatic attraction electrodes 40 embedded in the respective substrate placement portions 29A through 29D. Further, a common high-frequency applying mechanism 56 is provided for applying a high frequency as a bias voltage to the electrostatic attraction electrodes 40 embedded in the individual substrate placement portions 29A through 29D. Since the dc voltage applied to the electrostatic attraction electrodes 40 embedded in the respective substrate placement portions 29A through 29D can be individually controlled, the electrostatic attraction forces to the four substrates 2 placed on the substrate placement surfaces 31 of the four substrate placement portions 29A through 29D can be uniformed by eliminating variations.

Since other constructions and operations of the seventh embodiment are similar to those of the first embodiment, same elements are denoted by same reference numerals and descriptions are omitted.

(Eighth Embodiment)

Figure 23:
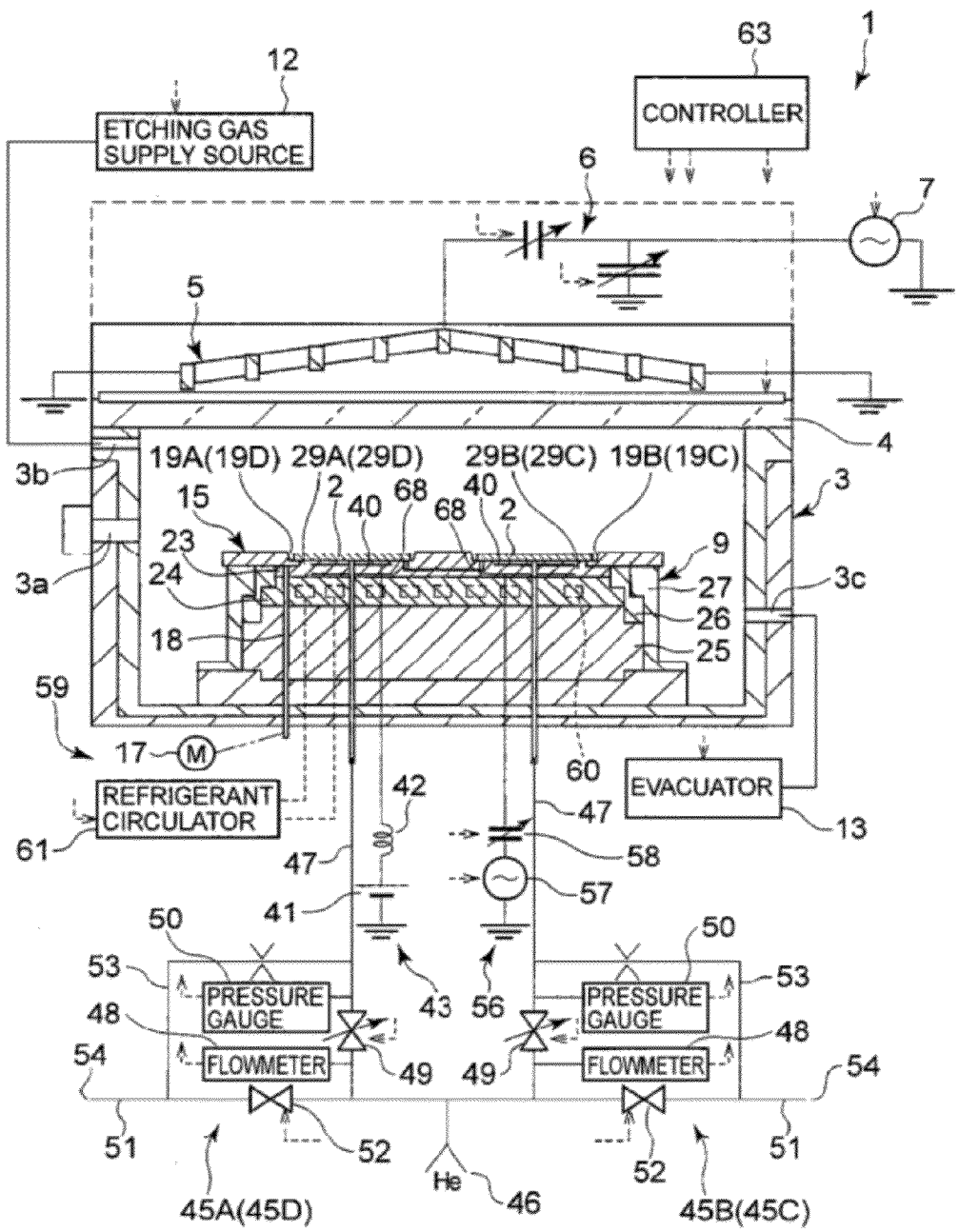
FIG. 23 is a schematic sectional view showing a dry etching apparatus according to an eighth embodiment of the present invention.

In the dry etching apparatus 1 of the eighth embodiment of the present invention shown in FIG. 23, the electrostatic attraction electrodes 40 are embedded in the respective substrate placement portions 29A through 29D. Further, a bias applying electrode 68 is embedded in each of the substrate placement portions 29A through 29D on the metal plate 24 side (lower side in the figure) with respect to the electrostatic attraction electrode 40. The bias applying electrode 68 is electrically insulated from the electrostatic attraction electrode 40. A high frequency is applied as a bias voltage from the common high-frequency applying mechanism 56 to the bias applying electrode 68 embedded in each of the individual substrate placement portions 29A through 29D.

An individually controllable high-frequency applying mechanism may be provided for each of the bias voltage applying electrodes 68 of the respective substrate placement portions 29A through 29D. By individually adjusting the high frequency applied as a bias voltage to each of the bias electrodes 68 embedded in the four substrate placement portions 29A through 29D, a uniform etching process can be achieved without variations among the four substrates 2 placed on the four substrate placement portions 29A through 29D.

Since other constructions and operations of the eighth embodiment are similar to those of the first embodiment, same elements are denoted by same reference numerals and descriptions are omitted.

(Ninth Embodiment)

Figure 24:
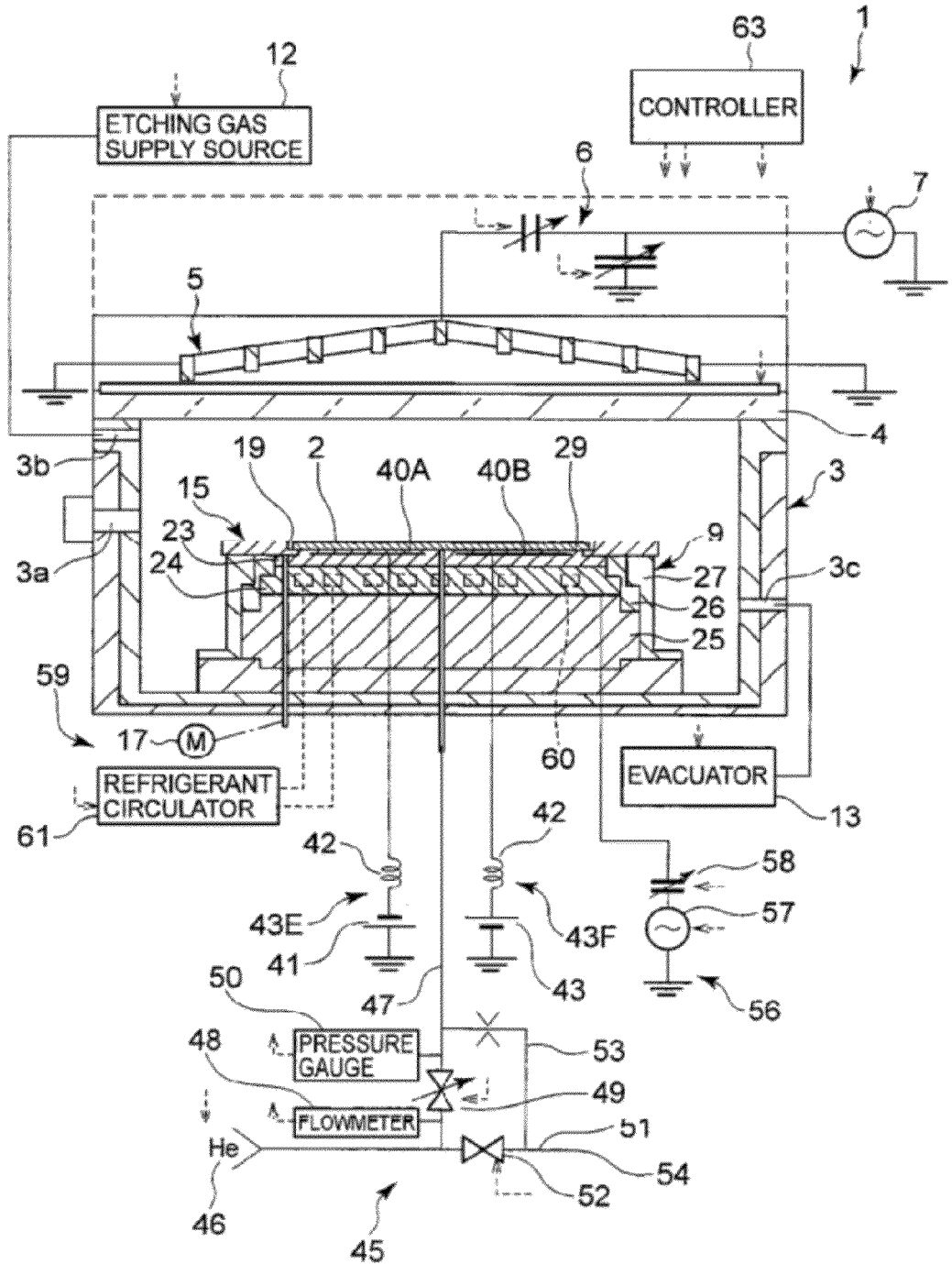
FIG. 24 is a schematic sectional view showing a dry etching apparatus according to a ninth embodiment of the present invention.
Figure 26A:
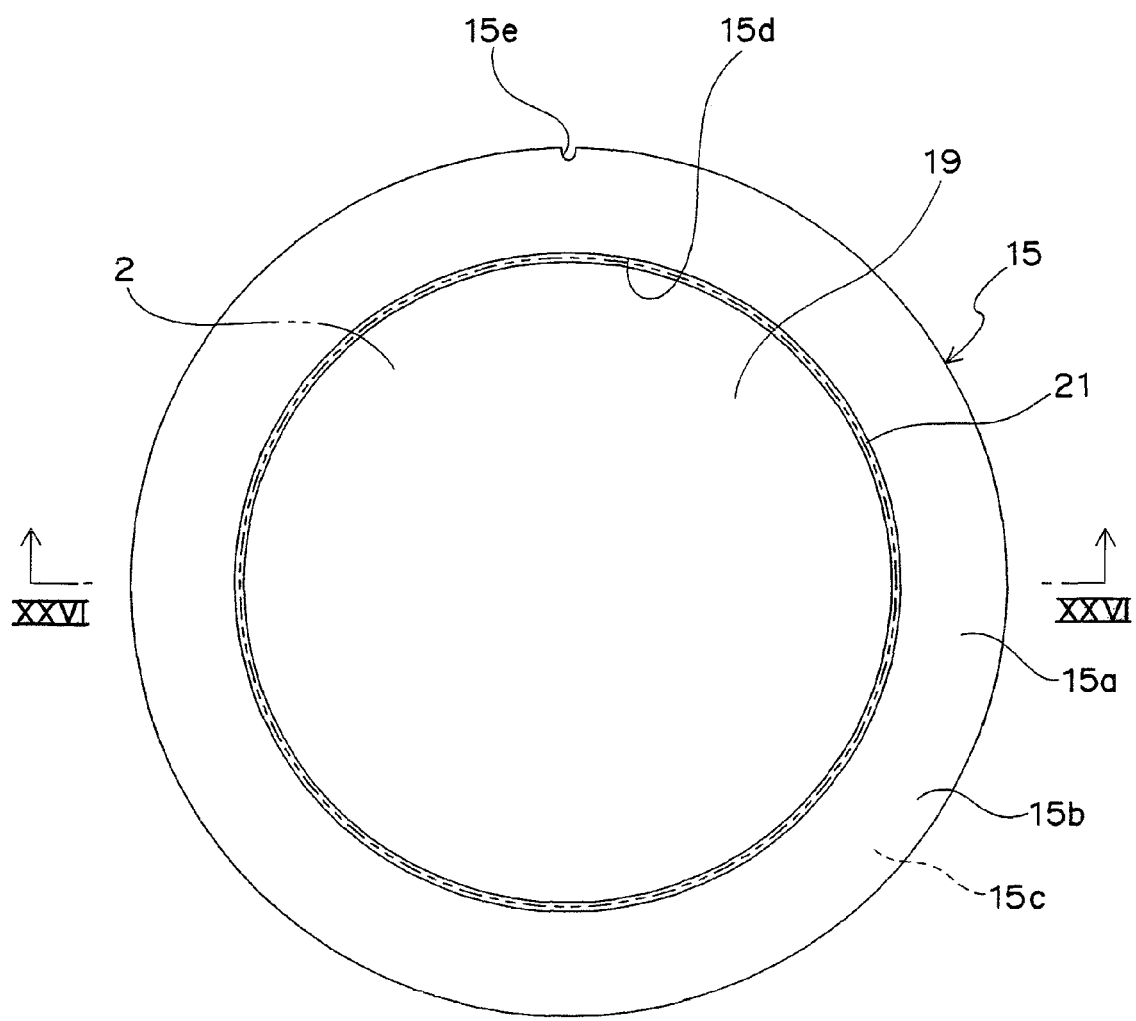
FIG. 26A is a plan view of the tray provided for the dry etching apparatus according to the ninth embodiment of the present invention.
Figure 26B:
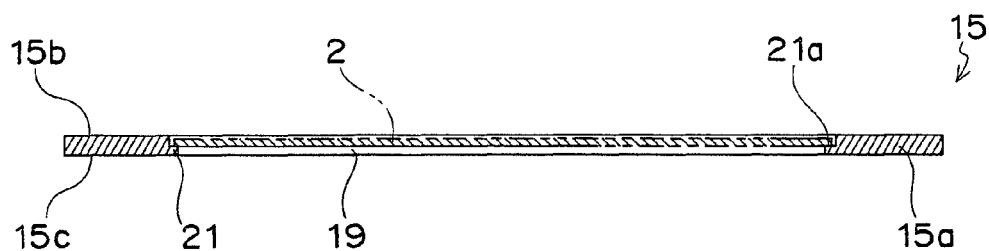
FIG. 26B is a sectional view taken along a line XXVI-XXVI of FIG. 26A.
Figure 27A:
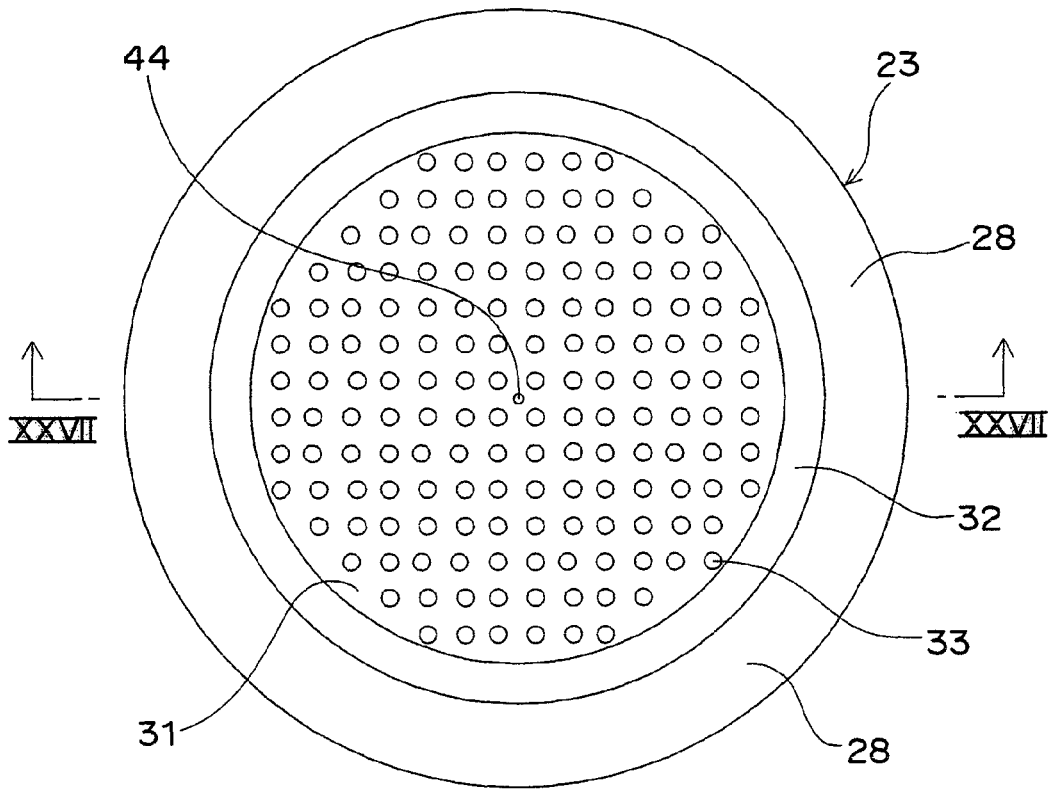
FIG. 27A is a plan view of the dielectric plate.
Figure 27B:
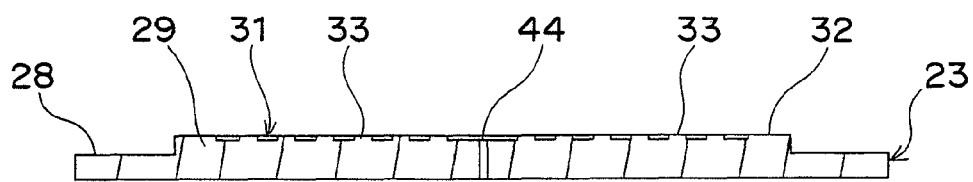
FIG. 27B is a sectional view taken along a line XXVII-XXVII of FIG. 27A.

FIG. 24 shows the dry etching apparatus 1 of the ninth embodiment of the present invention. As shown in FIGS. 25 through 26B, a single substrate accommodation hole 19 that penetrates through the thickness is formed at the tray 15. Further, an annular substrate support portion 21 projects from the hole wall 15*d* of the substrate accommodation hole 19. One substrate 2 accommodated in the substrate accommodation hole 19 is supported on the upper surface 21*a* of the substrate support portion 21. Further, as shown in FIGS. 25, 27A and 27B, the dielectric plate 23 of the substrate susceptor 9 has a single substrate placement portion 29. When the tray 15 is placed on the dielectric plate 23, the substrate placement portion 29 enters the substrate accommodation hole 19 from the lower surface 15*c* side of the tray 15, and the lower surface of the tray 15 is supported on the tray support surface 28 of the dielectric plate 23, whereby the substrate 2 is placed on the substrate placement surface 31 at the upper end of the substrate placement portion 29.

The electrostatic attraction electrode for attracting the substrate 2 is of a double-pole type. Specifically, two electrostatic attraction electrodes 40A and 40B are embedded in the substrate placement portion 29. Further, dc voltage applying mechanisms 43E and 43F are provided for the respective electrostatic attraction electrodes 40A and 40B, and dc voltages of mutually opposite polarities are applied to the respective electrostatic attraction electrodes 40A and 40B. In the first through eighth embodiments, the electrostatic attraction electrodes may be of the double-pole type. Conversely, the electrostatic attraction electrodes may be of the single-pole type in the present embodiment.

In the dry etching apparatus 1 of the present embodiment, one substrate 2 is accommodated in the tray 15, and therefore, wafer-by-wafer processing can be performed. Further, the apparatus is suitable for the processing of a substrate 2 of a relatively large area.

Since other constructions and operations of the ninth embodiment are similar to those of the first embodiment, same elements are denoted by same reference numerals and descriptions are omitted.

(Experiment 1)

Simulations for confirming that the substrate cooling efficiency was improved by the present invention were carried out. Specifically, a relation between an increase in the bias power and a rise in the substrate temperature was simulated with regard to Experimental Example, Comparative Example 1, and Comparative Example 2.

Experimental Example corresponds to the ninth embodiment of the present invention. The substrate 2 was a silicon wafer of two-inch size. The tray 15 on which the substrate 2 was accommodated in the substrate accommodation hole 19 that penetrated the tray 15 in the thickness direction was placed on the dielectric plate 23 of the substrate susceptor 9, and the lower surface 2a of the substrate 2 was placed directly on the substrate placement surface 31 and electrostatically attracted by the electrostatic attraction electrodes 40A and 40B of the double-pole type. The dc voltages applied to the respective electrostatic attraction electrodes 40A and 40B were set at ±900 V. Further, helium gas was supplied as the heat conduction gas between the substrate placement surface 31 and the lower surface 2a of the substrate 2, and the pressure was set at 800 Pa.

Comparative Example 1 is an example where the bottomed tray in which the substrate is placed is placed on the substrate susceptor, and the substrate is indirectly electrostatically attracted to the substrate susceptor via the tray. The substrate was a silicon wafer of two-inch size. Further, the dc voltages applied to the electrostatic attraction electrodes were set at ±900 V, helium gas was supplied as the heat conduction gas to the lower surface of the tray, and the pressure was set at 800 Pa.

Comparative Example 2 is an example where the bottomed tray in which the substrate is accommodated is placed on the substrate susceptor, and the vicinity of the outer peripheral edge is mechanically pressurized against the substrate susceptor side by a clamp ring, by which the substrate is fixed to the substrate susceptor. The substrate was a silicon wafer of four-inch size. Further, helium gas was supplied as the heat conduction gas to the lower surface of the substrate, and the pressure was set at 600 Pa.

The following conditions were unified with regard to Experimental Example and Comparative Examples 1 and 2.

The etching gas was chlorine gas ($Cl_2$), the flow rate was 50 scam, and the pressure was 2 Pa. The high-frequency power put into the ICP coil was set at 300 W. Discharge duration was set at 60 seconds. Further, the temperatures of the top plate, the chamber and the substrate susceptor (electrodes) were set at, 100° C., 100° C., and 20° C., respectively.

Figure 28:
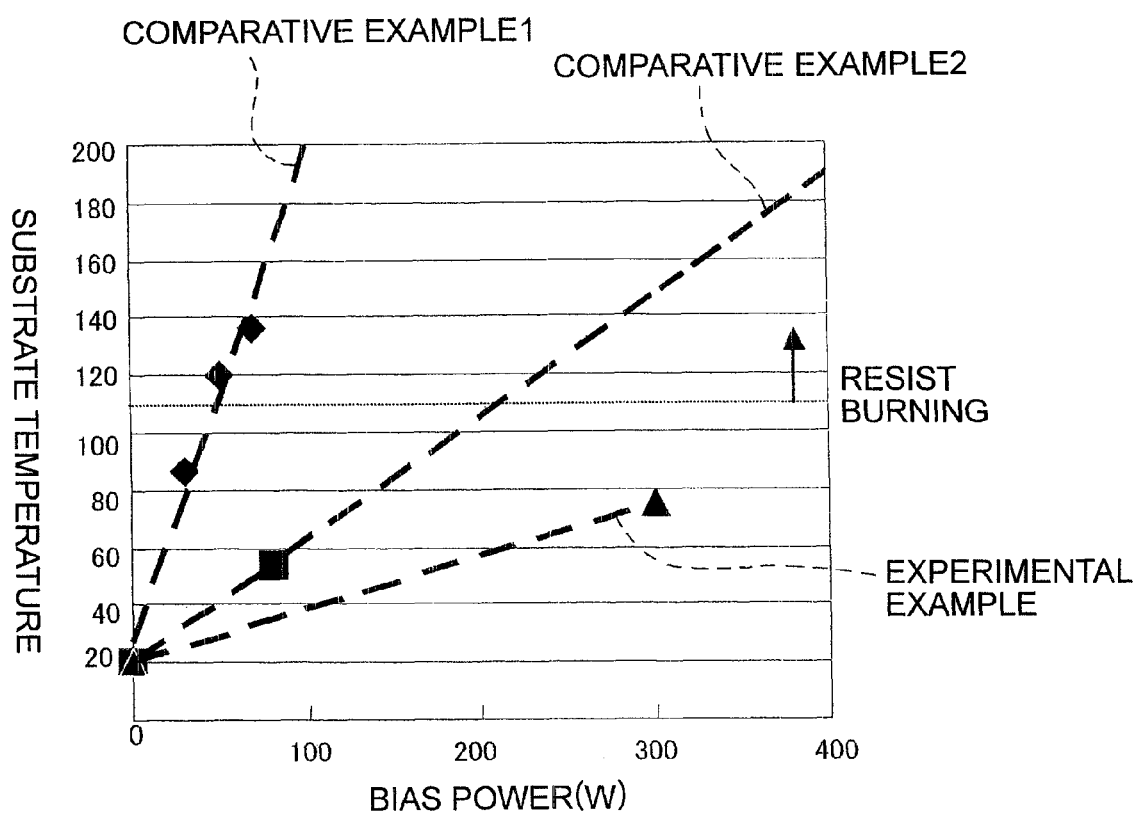
FIG. 28 is a graph showing a relation between a bias power and a substrate temperature.

FIG. 28 shows the simulation results. In Comparative Example 1, the substrate temperature rises up to approximately 110° C. at which resist burning occurs when the bias power is about 50 W. Further, in Comparative Example 2, the substrate temperature rises up to about 110° C. at which the resist burning occurs when the bias power is about 200 W. In contrast to these, in Experimental Example, the substrate temperature does not reach the temperature of approximately 110° C. at which the resist burning occurs even if the bias power is set at 400 W. The simulation results show that the substrate cooling efficiency in Experimental Example (present invention) is remarkably higher than in the prior art Examples 1 and 2.

(Experiment 2)

Simulations for confirming that the plasma processing in the entire region of the substrate surface was uniformed by the present invention were carried out. Rectangular coordinates (X-Y coordinate system) that have an origin at the center of the substrate were set on the substrate surface with regard to Experimental Example and Comparative Example 2, and the distribution of the etching rate (E/R) was simulated about them. The material of the substrate was nickel cobalt (NiCo) for both of Experimental Example and Comparative Example 2.

Figure 29:
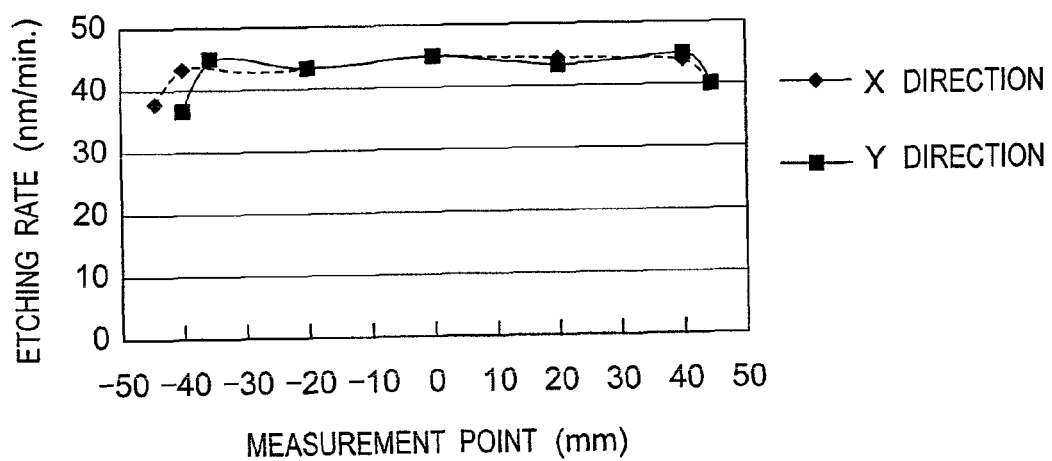
FIG. 29 is a graph showing an etching rate distribution of Comparative Example 2.
Figure 30:
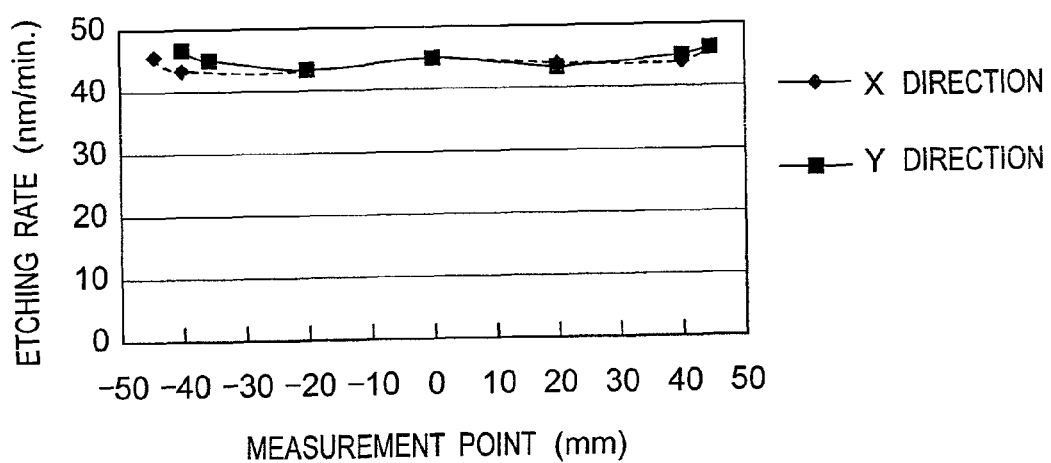
FIG. 30 is a graph showing an etching rate distribution of Experimental Example.

The simulation results of Comparative Example 2 are shown in FIG. 29, and the simulation results of Experimental Example are shown in FIG. 30. According to Comparative Example 2, the etching rate is lower at the vicinity of the outer peripheral edge than at the vicinity of the center of the substrate, and the distribution of the etching rate is nonuniform due to the existence of the clamp ring at the outer peripheral edge of the substrate. Specifically, the average value of the etching rate at the position of 5 mm in the X-direction and 5 mm in the Y-direction apart from the center of the substrate is 42.5 nm/min, in contrast to which the average value of the etching rate at the position of 10 mm in the X-direction and 10 mm in the Y-direction apart from the center of the substrate is 43.9 nm/min, meaning that a difference of 1.4 nm/min is between both of them. In contrast to this, according to Experimental Example, the etching rate is uniformed in the entire region ranging from the vicinity of the center of the substrate over to the vicinity of the outer peripheral edge. Specifically, the average value of the etching rate at the position of 5 mm in the X-direction and 5 mm in the Y-direction apart from the center of the substrate is 44.5 nm/min, and the average value of the etching rate at the position of 10 mm in the X-direction and 10 mm in the Y-direction apart from the center of the substrate is 43.9 nm/min, meaning that only a difference of 0.6 nm/min is between both of them. In comparison with Comparative Example 2, a difference in the average value of the etching rate between the position of 5 mm and the position of 10 mm apart from the center of the substrate is reduced to less than one half according to Experimental Example (present invention).

The present invention is not limited to the above-described embodiments but allowed to be variously modified. For example, although the present invention has been described taking the ICP type dry etching apparatus as an example, the present invention can be applied to an RI (reactive ion) type plasma processing apparatus for dry etching, plasma CVD and to a plasma processing method.

The invention claimed is:

1. A plasma processing method comprising:
providing a tray formed with a plurality of substrate accommodation holes that penetrate through a thickness thereof, and provided with a substrate support portion that projects from a hole wall of each of the substrate accommodation holes;
accommodating substrates in respective substrate accommodation holes of the tray, thereby an outer peripheral edge portion of a lower surface of each of the substrates is supported by the substrate support portions so that the lower surface of each of the substrates is exposed by each of the substrate accommodation holes viewed from a lower surface side of the tray;
placing the tray with the plurality of substrates accommodated therein above an upper portion accommodated in a depressurizeable chamber;
moving downward the tray toward the upper portion so that the lower surface of the tray is supported by a tray support portion of the upper portion and so that a plurality of substrate placement portions respectively projecting from the tray support portion are inserted to the substrate accommodation holes from the lower surface side of the tray, thereby the lower surface of each of the substrate is placed on a substrate placement surface that is an upper end surface of each of the substrate placement portions,
wherein a distance from the tray support portion to an upper surface of the substrate support portion is smaller than a distance from tray support portion to the substrate placement surfaces so that the lower surface of the substrates placed on the substrate placement surfaces are separated to the substrate support portions of the tray with gaps of a predetermined amount;
electrostatically attracting each of the substrates to the substrate placement surfaces by applying a dc voltage to an electrostatic attraction electrode at least a portion of which is embedded in the substrate placement portion;
circulating a refrigerant so as to cool the upper portion having the tray support portion on which the lower surface of the tray is placed and the substrate placement surfaces on which the substrates are placed;
supplying a heat conduction gas to a space formed between the lower surfaces of the substrates and the substrate placement surfaces; and
generating plasma in the chamber.

2. The plasma processing method according to claim 1, wherein the upper portion is provided on a lower portion, and
wherein a high-frequency voltage for generating the plasma is applied to the lower portion.

3. The plasma processing method according to claim 1 wherein a high-frequency voltage for generating the plasma is applied to the electrostatic attraction electrodes so as to be superimposed on the dc voltage.

4. The plasma processing method according to claim 1 wherein a plurality of second electrodes are embedded in the upper portion, the second electrodes being insulated to the electrostatic attraction electrodes and respectively provided for substrate support portions, and
wherein a high-frequency voltage for generating plasma is applied to the second electrodes.

* * * * *